(12) United States Patent
Matsumoto

(10) Patent No.: US 6,295,634 B1
(45) Date of Patent: Sep. 25, 2001

(54) WIRING DESIGN APPARATUS, WIRING DETERMINATION APPARATUS AND METHODS THEREOF

(75) Inventor: Hiroyuki Matsumoto, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/285,942

(22) Filed: Apr. 2, 1999

(51) Int. Cl.$^7$ .............................. G06F 17/50; G06F 7/60; G06F 17/10; G06F 101/00
(52) U.S. Cl. .................................. 716/12; 703/2
(58) Field of Search ............................. 716/12–15; 703/2

(56) References Cited

PUBLICATIONS

Su et al.; "Post–route optimization for improved yield using a rubber–band wiring model"; IEEE/ACM Int. Conf. Comp. Aided Design; pp. 700–706, Nov. 1997.*

Yu et al.; "Interchangeable pin routing with application to package layout"; IEEE/ACM Int. Conf. CAD; pp. 668–673, Nov. 1996.*

Ellis et al.; "A hierarchical decomposition methodology for multistage clock circuits"; IEEE/ACM Int. Conf. CAD; pp. 266–273, Nov. 1997.*

Lee et al.; "On Steiner tree problem with 45/spl deg/ routing"; IEEE ISCAS '95; pp. 1680–1682, Apr. 1995.*

Lu et al.; "A numerical stable algorithm for constructing constrained Delaunay triangulation and application to multicjip module layout"; IEEE Int. Conf. Circuits & Sys.; pp. 644–647, Jun. 1991.*

Dai: "Performance driven layout of thin–film substrates for multichip layouts"; IEEE Int. Symp. Circuits & Sys.; pp. 2308–2311, Jun. 1991.*

* cited by examiner

Primary Examiner—Kevin J. Teska
Assistant Examiner—Hugh Jones
(74) Attorney, Agent, or Firm—Margaret A. Pepper

(57) ABSTRACT

The present invention relates generally to effectively design a wiring of a semiconductor package, etc., in a short time. A wiring design software (SW) reads in design information indicating disposition of pads on a chip, disposition of pins on a package, and relationship of correspondence between the pads and the pins, analyzes it to prepare a wiring problem, classifies the pads and the pins into source and sink elements, and assigns consecutive identification numbers to the pads and the pins with a same identification number being assigned to a pad and a pin which are connected each other (S102, . . . , S108). The wiring design SW generates a virtual triangle having a source/sink element as an apex by applying Delaunay triangulation to the source and the sink elements (S110). The wiring design SW level classifies the pins using the generated triangle (S200). The wiring design SW determines whether or not an edge of the triangle crosses a wiring and connects the edges which are determined to cross each other to derive a route of wiring (S220), outputting the result of wiring design (S118).

20 Claims, 24 Drawing Sheets

- □ SOURCE ELEMENT ← DIRECTION OF PULLING OUT
- ○ SINK ELEMENT ---- VIRTUAL RING

☐ SOURCE ELEMENT ←— DIRECTION OF PULLING OUT

————— VIRTUAL RING

○ SINK ELEMENT  ——— EDGE OF DELAUNAY TRIANGULATION
⊘ SOURCE ELEMENT

○ SINK ELEMENT — EDGE OF DELAUNAY TRIANGULATION
⊘ SOURCE ELEMENT

| STATIC_ID | LEVEL |
|---|---|
| 0 | 1 |
| 1 | 2 |
| 2 | 3 |
| 3 | 4 |
| 4 | 5 |
| 5 | 6 |
| 6 | 1 |
| 7 | 2 |
| 8 | 3 |
| 9 | 4 |
| 10 | 5 |
| 11 | 6 |

○ SINK ELEMENT     ——— EDGE OF DELAUNAY
                         TRIANGULATION
⊘ SOURCE ELEMENT

WIRING DESIGN APPARATUS, WIRING DETERMINATION APPARATUS AND METHODS THEREOF

FIELD OF THE INVENTION

The present invention relates to a wiring design apparatus, wiring determination apparatus and methods thereof for designing an optimum wiring routine between bonding pads provided on a semiconductor chip and pins (terminals) provided on a semiconductor package.

BACKGROUND OF THE INVENTION

A wiring design apparatus which automatically or semi-automatically designs a wiring of a printed circuit substrate or a wiring between bonding pads of a semiconductor chip and pins (terminals) of a semiconductor package which is used in a electronic equipment is disclosed in PUPA 5-143689. An improvement of wiring route and design speed has been disclosed, however, it is not determined until the wiring design has been completed whether or not wiring of a printed circuit and the like is 100% possible (whether or not a wiring solution exists) in the prior art wiring design apparatus.

In designing wiring in a specific area such as a wiring of a semiconductor package, an illegal wiring in which the wire density among the pins is unnecessarily dense and the route detours excessively, or turns round the periphery of pins has to be detected and corrected even if there is a wiring solution.

However, prior to this invention it was not possible to detect such illegal wiring until the wiring design had been completed in the prior art wiring design apparatus.

When the prior art wiring design apparatus was used, additional work for correcting information of the subject of wiring (design information) included disposition of parts on a printed circuit substrate or disposition of bonding pads of a semiconductor chip and pins of a semiconductor package, work on wiring design and work of detecting and correcting an illegal wiring have to be repeated again and again until a wiring solution is obtained and all the wires follow an optimum route.

Such repetition of work took a very long time and it is a heavy burden on the designer.

On the other hand, "Algorithm C++" by Robert Sedwick published by Kindai-Kagaku Co., pages 461-; (original publication "Algorithm in C++", 1990, Addison Wesley Co.., Inc., MA, USA) discloses Volonoi polygon method and Delaunay triangulation method (they are essentially the same though differently named) as a method of solving a problem relating to a distance between an arbitrary point on a plane and multiple points (mother points) given on the same plane. No wiring determination apparatus has ever existed so far which uses Delaunay triangulation method in wiring design to quickly determine presence or absence of wiring solution for detecting and correcting an illegal wiring.

PURPOSES AND SUMMARY OF THE INVENTION

This invention is conceived in view of the above described problems of the prior art and aims at provision of a wiring design apparatus, a wiring determination apparatus and methods thereof which can quickly determine whether or not wiring is 100% possible (whether or not there is a wiring solution) in wiring a printed circuit substrate and the like before the wiring design has been totally completed.

Therefore, one purpose of this invention is to provide a wiring design apparatus, a wiring determination apparatus and methods thereof which can detect and correct an illegal wiring in which the route detours excessively, or turns round the periphery of pins before the wiring design has been totally completed in designing wiring in a specific area such as a wiring of a semiconductor package.

Another purpose of this invention is to provide a wiring design apparatus, a wiring determination apparatus and methods thereof which can efficiently obtain a wiring solution in wiring design to allow an illegal wiring to be detected and corrected for largely decreasing the burden on the designer.

Still another purpose of this invention is to provide a wiring design apparatus, a wiring determination apparatus and methods thereof which can quickly and efficiently obtain an optimum wiring solution utilizing the Delaunay triangulation method in wiring design.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIGS. 34A and 34B are a flow chart showing the process of detecting a concentration of wiring shown in FIG. 33 (S320), wherein FIG. 34A shows the left side of the flow chart and FIG. 34B shows the right side of the flow chart.

DETAILED DESCRIPTION OF THE INVENTION

Wiring Design Apparatus

Figure 1:
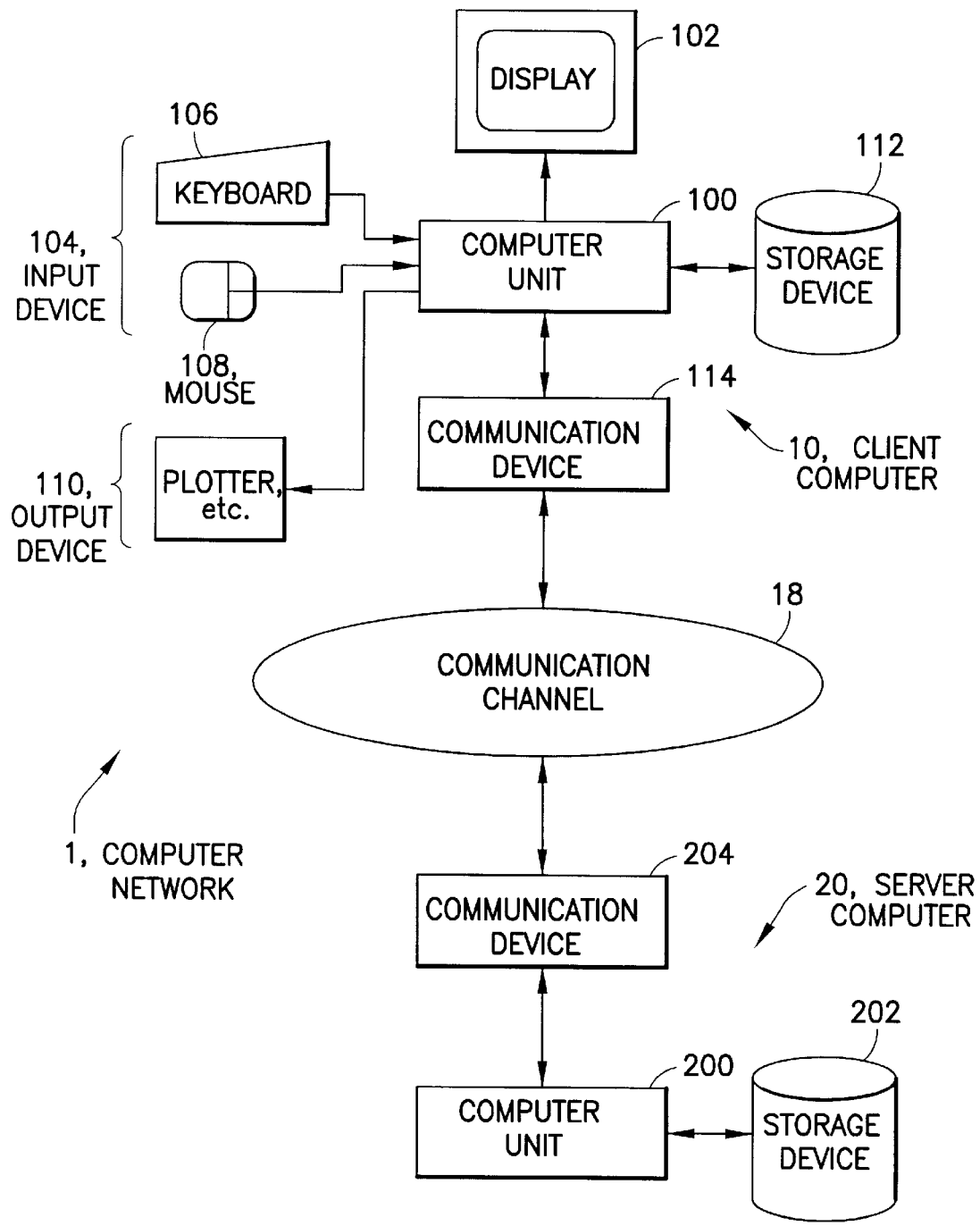
FIG. 1 is a diagram showing an example of the configuration of the computer network to which this invention is adapted.

This invention provides a wiring design apparatus for designing a wiring which connects any one of a plurality of points (sink elements) provided on a plane to any one of a plurality of points (source elements) provided on said plane other than the sink elements with a route lying on said plane comprising; triangle generating means for generating by Delaunay triangulation method a plurality of virtual triangles each having a sink and a source elements as apexes on said plane, level classifying means for classifying sink elements contained as an apex in a triangle among said generated triangles which has one of the source elements as an apex into the lowest level (level 1), and classifying another sink element contained as another apex in a triangle which has as an apex a sink element of a level K into a level (K+1), said another sink element being other than a level K and (K−1) (K is an integer equal to or greater than 1), and wiring design means for so designing a plurality of wiring routes connecting any one of the sink elements to any one of the source elements corresponding to the sink element that the level of the sink element contained as an apex in a triangle among said generated triangles passed by the wiring is the lowest for each of the wiring.

Preferably, said wiring design means comprises; crossing determination means for determining that an edge of said triangle having as an apex only at a sink element which is not higher than a level (K+n) is an edge which is crossed by one or more wirings (wiring M) each connecting a sink element which is not lower than the level K and a source element corresponding to such sink element, and route deriving means for sequentially connecting 2 edges which are contained in a same one of said triangles and determined to be crossed by said wiring M each other to derive a route of each of the wirings M.

Preferably, said source element is a bonding pad of a semiconductor chip mounted on a semiconductor package, said sink element is a terminal provided in said semiconductor package so as to surround said semiconductor chip, said plane is the wiring plane of said semiconductor package on which is provided a wiring connecting each of said terminals to each of said bonding pads, said triangle generating means generates a plurality of virtual triangles having as an apex said bonding pad and said terminal on the wiring plane of said semiconductor chip by Delaunay triangulation, said level classifying means classifies said terminal contained as an apex in a triangle among said generated triangles which has one of the bonding pads as an apex into the level 1, and classifies said terminal other than the level K and (K−1) of another apex of a triangle which has as an apex one of said terminals of the level K into a level (K+1), said crossing determination means in said wiring design means determines that an edge of said triangle having as an apex only said terminal which is not higher than a level (K+n) is an edge which is crossed by one or more wirings (wiring M) each connecting each of the terminals which is not lower than the level K to each of said bonding pads corresponding to the terminals, and said route deriving means in said wiring design means sequentially connects 2 edges which are contained in a same one of said triangles and determined to be crossed by said wiring M each other to derive a route of each of the wirings M.

Preferably, said wiring design means further comprises identification number assigning means for assigning an identification number at least to each of the sink elements, said crossing determination means in said wiring design means determines that each edge of said triangle is crossed by a wiring (wiring M) connecting each of the sink elements (point M') assigned a number between the identification numbers of the sink elements at the ends of the edge to each of the source elements corresponding to each of said points M', and said route deriving means in said wiring design means derives a route of each of the wirings M' determined to be crossed by each of the edges of said triangle.

Preferably, one or more sink elements (point N) assigned identification numbers near the first number and one or more sink elements (point N') assigned identification numbers near the last number are contained in a same triangle as apexes, grouping means is provided for separating from the sink elements a first group containing all said points N other than said points N' which are assigned identification numbers continuing from the first identification number and a last group containing all said points N' other than said point N which are assigned identification numbers continuing down from the last identification number, said crossing determination process in said wiring design means determines, when the sink element of said first group and the sink element of said last group are the ends of an edge of said triangle, that each edge of said triangle is crossed by a wiring M' which connects each of sink elements assigned identification numbers which are larger than the identification number of the sink elements of the last group at one end of an edge of said triangle and those assigned identification numbers which are smaller than the identification number of the sink elements of the first group to each source element corresponding to such sink elements, said route deriving means derives the route of each of the wirings M' which is determined to cross each edge of said triangle which has the sink element of said first group and the sink element of said last group as ends thereof.

Preferably, route modifying means is further provided for modifying, when the number of said wirings M' crossing the edge of said triangle is larger than a predetermined wiring capacity, a route of said wiring M' crossing this edge to a route crossing the edge of another triangle.

This invention provides another wiring design apparatus for designing a wiring which connects any one of a plurality of points (sink elements) provided on a plane to any one of a plurality of points (source elements) provided on said plane other than the sink elements with a route lying on said plane, said wiring passing a wiring route including a predetermined partial route, said apparatus comprising; triangle generating means for generating a plurality of virtual triangles having a sink and a source elements as apexes on said plane by Delaunay triangulation method, level classifying means for classifying sink elements contained as an apex in a triangle of said generated triangles which has one of the source elements as an apex into the lowest level (level 1), and classifying another sink element contained as another apex in a triangle which has as an apex a sink element of a level K into a level (K+1), said another sink element being other than a level K and (K−1) (K is an integer equal to or greater than 1), weighting coefficient setting means for setting a weighting coefficient which has as larger value as said level is higher, and partial route selecting means for selecting said partial route such that a cumulative sum of multiplication of the length of each of said partial route included in the route of said wiring by a weighting coefficient set to each of the edge of said triangle crossing each of said partial route is minimum.

Effect of Each of Means of the Wiring Design Apparatus

The wiring design apparatus of this invention designs a wiring connecting each of bonding pads (source elements) of a semiconductor chip mounted on a semiconductor package such as a pin grid array package to each of pins (source elements) provided on the semiconductor package surrounding the semiconductor chip on a same wiring plane in a route which does not cause an illegality such as crossing and detouring by applying Delaunay triangulation to the wiring design.

Effect of Triangulation Means

The triangulation means divides the wiring plane of a semiconductor package by Delaunay triangulation into a plurality of virtual triangles (Delaunay triangles) each having a pin and a bonding pad as apexes.

Effect of Level Classifying Means

The level classifying means classifies a pin contained as an apex in a Delaunay triangle which contains a bonding pad ("contained as an apex" is hereinafter expressed simply as "contained") into the class 1. The level classifying means similarly continues to classify pins other than the level 1 contained in Delaunay triangles containing pins of the level 1 into the level 2, pins other than the level 1 and 2 contained in Delaunay triangles containing pins of the level 2 into the level 3, and pins other than the level 2 and 3 contained in Delaunay triangles containing pins of the level 3 into the level 4, and so on sequentially until all pins are classified.

The level described here gives a positional relationship between a pin and a bonding pad and plays an important roll of determining the validity of a wiring and whether or not each wiring can connect two points to be connected. Incidentally, the naming of the levels which increases by one stepwise is for convenience and is substantially same even if the naming is changed to level A, level B . . . or level 1, level 2, level 4, . . . so long as each level gives a positional relationship between a pin and a bonding pad based on Delaunay triangulation.

Effect of Wiring Design Means

The wiring design means designs each wiring between a pin and a bonding pad so as to assume a route in which the level of a pin contained in a Delaunay triangle passed by each wiring is the lowest. For example, if a wiring inevitably assumes a route passing a Delaunay triangle containing a bonding pad and a pin of the level 1, the wiring design means so designs that such wiring assumes a route passing only a Delaunay triangle containing a pin which is lower than the level 3.

The wiring design means designs a wiring according to such rule because a Delaunay triangle containing a bonding pad and a pin of the level 1 surrounds a semiconductor chip and a Delaunay triangle containing pins of the level 1 and the level 2 surrounds a Delaunay triangle containing a bonding pad and a pin of the level 1, . . . when Delaunay triangulation is applied to a pin grid array (PGA) package and pins are classified, and because it is thus considered that an illegality such as detouring is caused if the route of a wiring passing only a Delaunay triangle containing pins lower than a level k+1 assumes a route passing a Delaunay triangle containing pins higher than a level (k+n−1), where k and n is an integer, when the connection is made in the shortest route.

Effect of Identification Number Assigning Means

Each means included in the wiring design means is further described hereunder.

In the wiring design means, the identification number assigning means assigns consecutive identification numbers to bonding pads and a same identification number as the bonding pad to a pin which is connected to the bonding pad. In other words, a pin connected to a bonding pad which is assigned an identification number STATIC_ID_X is assigned the same identification number STATIC_ID_X as the bonding pad.

A specific example where pins arrayed in a (n×3) matrix are considered hereunder in which row elements are in parallel with an edge of a semiconductor chip in a portion excluding the corners of pin columns of a PGA package. The identification number assigns a largest identification number to a pin (level 1) of a row nearest the semiconductor chip (row 1), a least identification number to a pin (level 2) of intermediate rows (row 2), and an identification number of an intermediate value to a pin (level 3) of the furthest row (row 3) in a same column.

Specifically, this example shows that identification numbers are assigned according to a rule to assign consecutive identification numbers (q+2), q, (q+1), (q+5), (q+3), (q+4), (q+8), (q+6), (q+7) to 9 pins [1,p] to [3, p2] included in a column (p to p+2).

Effect of Crossing Determination Means

The crossing determination means determines using the identification number that a wiring to a pin which is assigned an identification number of an intermediate value of identification numbers passes between 2 pins of a same level at the ends of a Delaunay triangulated edge, and that a wiring to a pin which is assigned an identification number of an intermediate value of identification numbers passes between 2 pins of different levels K, (K+1) at the ends of a Delaunay triangulate edge.

The above example is now described.

The crossing determination means determines that the Delaunay triangulated edge between pins [1,p], [1,p+1] of the column 1 (identification number (q+2), (q+5)) is crossed by a wiring [2,p+1], [3,p+1] to pins [2,p+1], [3, p+1] of the columns 2, 3 (identification number (q+3), (q+4)) the identification numbers of which are intermediate these 2 pins.

Similarly, the crossing determination means determines that the triangulated edge of a Delaunay triangle between pins [1,p+1] of the column 1 and [2,p+1] of the column 2 (identification number (q+5), (q+3)) is crossed by a wiring [3,p+1] connected to a pin [3,p+1] of the column 3 (identification number (q+4)) the identification numbers of which are intermediate these 2 pins.

Further, the crossing determination means similarly determines that the triangulated edge of a Delaunay triangle between pins [2,p+1], [2,p+2] (identification number (q+3), (q+6)) is crossed by a wiring [3,p+1] connected to a pin [3,p1] of the column 3 (identification number (q+4)) the identification numbers of which are intermediate these 2 pins.

Effect of Route Deriving Means

The route deriving means sequentially connects the points on the triangulated edge which is contained in a same Delaunay triangle and was determined to be crossed by a wiring M which is determined to be crossed by a wiring to a same pin for one or more Delaunay triangles until a wiring route is connected between a bonding pad and a pin for deriving a route of wiring.

In deriving the route, the route deriving means follows a rule to cause each wiring between a bonding pad and a pin to assume a route in which the level of a pin contained in the Delaunay triangle it passes is the lowest level and detects a route which can not assume a route other than a route which violates this rule as an illegal wiring.

The route deriving method is now described using the above example.

The route deriving means first connects a pin [1,p+1] of the column 1 to the bonding pad corresponding to this pin by a wiring [1,p+1].

The route deriving means then connects 2 points on a triangulated edge [1, p], [1,p+1] which contains pins [1, p+], [1, p+1] of the column 1 as the ends thereof to bonding pads corresponding to pins [2, p+1], [3, p+1] of the columns 2, 3 by a wiring [2,p+1], [3,p1] so that no crossing occurs.

The route deriving means then connects a connecting points of a wiring [2, p+1] on a triangulated edge [1, p], [1,p+1] which contains pins [1, p], [1, p+1] of the column 1 as the ends thereof to a pin [2, p+1] of the column 2 by a wiring [2, p+1] so that no crossing occurs.

The route deriving means then connects a point on a triangulated edge [1, p+1], [2,p+1] of a Delaunay triangle which contains a pin [1, p+1] of the column 1 and a pin [2, p+1] of the column 2 as the ends thereof to a connecting point of a wiring [3, p+1] on a triangulated edge [1, p], [1, p+1] by a wiring [3, p+1] so that no crossing occurs.

The route deriving means then connects a point on a triangulated edge [2, p+1], [2,p+2] which contains pins [2, p+1], [2, p+2] of the column 2 as the ends thereof to a connecting point of a wiring [3, p+1] on a triangulated edge [1, p+1], [2, p+1] by a wiring [3, p+1] so that no crossing occurs.

The route deriving means then connects a connecting point of a wiring [3,p+1] on a triangulated edge [2, p+1], [2,p+2] to a pin [3, p+1] by a wiring [3, p+1] so that no crossing occurs.

By repeating connections as so far described between points on each triangulated edge of a triangle sequentially for wirings, the route deriving means derives route of wirings.

Effect of Grouping Means

Because pins of a PGA package are disposed so as to surround the periphery of a semiconductor package, if consecutive identification numbers are assigned to pins beginning at 1 by the identification number assigning means, there is a portion where a pin assigned the top of the identification number sequence is adjacent to a pin assigned the tail of the identification number sequence (so called a re-entrant portion). In such case, an inexpedience is induced in the process of determining by the crossing determination means the crossing of a wiring route and a triangulated edge of a Delaunay triangle.

Specifically, when a wiring s' to a pin assigned an identification number s' which is larger than an identification number s is passed between a pin r assigned an identification number near the first number and a pin s assigned an identification number near the last number, the wiring s' may not be passed between the pins r, s by the above described normal processing of the crossing determination means because the identification numbers do not satisfy the relationship s<s'<r.

Therefore, the grouping means classifies a pin which is possibly adjacent to a pin assigned an identification number near the tail into the first group while classifying a pin which is possibly adjacent to a pin assigned an identification number near the top into the last group.

The crossing determination means effects the above described normal processing for a pin which does not belong to any of these groups while it handles a portion where a pin of the last group is adjacent to a pin of the first group as if the identification number of the pin of the last group is smaller than the identification number of the pin of the first group for determining the crossing of a wiring and a triangulated edge of a Delaunay triangle.

Effect of the Route Modifying Means

All pins of a semiconductor package may not be connected by a wire depending on a structure of a semiconductor device. In such case, locally concentrating wiring routes may be modified so as to pass nearby a pin which is not connected to a wire and is of a relatively low wiring density.

When there is a pin not connected and the number of wirings crossing a triangulated edge of a Delaunay triangle is greater than the wiring capacity which is derived from a design rule and the length of wiring, the route modifying means determines that unsuitably many wires are passed through the triangulated edge (between pins) (wirings are crowded) and modifies a part of the routes of wirings crossing the triangulated edge so as to cross another triangulated edge which is adjacent to the crowded edge and is not crowded for optimizing the wiring route.

Wiring Determination Apparatus

This invention also provides a wiring determination apparatus for determining the validity of wiring which connects any one of a plurality of points (sink elements) provided on a plane to any one of a plurality of points (source elements) provided on said plane other than the sink elements with a route lying on said plane comprising; triangle generating means for generating a plurality of virtual triangles having a sink and a source elements as apexes on said plane by Delaunay triangulation method, level classifying means for classifying sink elements contained as an apex in a triangle of said generated triangles which has one of the source elements as an apex into the lowest level (level 1), and classifying another sink element contained as another apex in a triangle which has as an apex a sink element of a level K into a level (K+1), said another sink element being other than a level K and (K−1) (K is an integer equal to or greater than 1), and wiring determination means for determining that a wiring connecting a sink element of a level K to a source element is valid when the route of such wiring crosses only an edge of said triangle having only sink elements lower than a level (K+n+1) (n is an integer) as the ends thereof and determining that a wiring connecting a sink element of a level K to a source element is invalid when such wiring crosses an edge of said triangle having only sink elements higher than a level (K−1) as the ends thereof.

This invention also provides another wiring determination apparatus for determining the validity of wiring which connects any one of a plurality of points (sink elements) provided on a plane to any one of a plurality of points (source elements) provided on said plane other than the sink elements with a route lying on said plane comprising; triangle generating means for generating a plurality of virtual triangles having a sink and a source elements as apexes on said plane by Delaunay triangulation method, level classifying means for classifying sink elements contained as an apex in a triangle of said generated triangles which has one of the source elements as an apex into the lowest level (level 1), and classifying another sink element contained as another apex in a triangle which has as an apex a sink element of a level K into a level (K+1), said another sink element being other than a level K and (K −1) (K is an integer equal to or greater than 1), weighting coefficient setting means for setting a weighting coefficient which has as larger value as said level is higher, and wiring determination means for accumulating the sum of multiplication of the length of each of said partial route included in the route of said wiring by a weighting coefficient set to each of the edge of said triangle crossing each of said partial route to determine the validity of each of said wiring routes.

Effect of Wiring Determination Apparatus

In the wiring determination apparatus of this invention, the effect of the triangle generating means and the level classifying means is same as those of the wiring design apparatus of this invention.

Based on a design rule of the wiring design means of the wiring design apparatus of this invention (each wiring between a pin and a bonding pad is so designed as to assume a route in which the level of a pin contained in a Delaunay triangle passed by each wiring is the lowest), the wiring determination means determines that only the route of wiring which meets this rule is valid and determines that a wiring route violating this rule may possibly be invalid (causing detouring which makes a wiring unnecessarily long).

Specifically, the wiring determination means determines that a wiring connecting a pin of a level K and a bonding pad assumes an invalid route such as detouring when the wiring passes a triangulated edge of a Delaunay triangle having a pin of a level higher than a level (K+n) as an end point while it determines that the wiring assumes an optimum route otherwise, i.e., when it passes only a triangulated edge of a Delaunay triangle having only a pin of a level lower than a level (K+n+1) as an end point.

Also, based on the length of each triangulated edge of a Delaunay triangle and the design rule of a wiring design, the number of wirings which may cross each triangulated edge can be estimated. Accordingly, when the number of wirings which is determined to cross each triangulated edge can not be made less than the number of wirings estimated to be allowed to cross each triangulated edge as a result of wiring design, it is found that a suitable wiring solution which is free from detouring or concentration of wirings can not be obtained.

By notifying a designer of such event as soon as it is found, the designer can be prompted of a necessity of redesign in an early stage.

Also, in another wiring determination apparatus, the weighting coefficient setting means sets as large weighting coefficient to each edge of a triangle as the level of the end point of the edge of the triangle.

The wiring determination means multiplies the length of each route between node points of a wiring route (partial route) by a weighting coefficient of an edge of a triangle crossing each partial route and accumulates the multiplications for wirings for presentation to a user, for example, as a value for evaluating by taking both the length and redundancy of wiring in to consideration.

Wiring Design Method

This invention provides a wiring design method for designing a wiring which connects any one of a plurality of points (sink elements) provided on a plane to any one of a plurality of points (source elements) provided on said plane other than the sink elements with a route lying on said plane comprising the steps of; generating a plurality of virtual triangles having a sink and a source elements as apexes on said plane by Delaunay triangulation method, classifying sink elements contained as an apex in a triangle of said generated triangles which has one of the source elements as an apex into the lowest level (level 1), and classifying another sink element contained as another apex in a triangle which has as an apex a sink element of a level K into a level (K+1), said another sink element being other than a level K and (K −1) (K is an integer equal to or greater than 1), and so designing a plurality of wiring routes connecting any one of the sink elements to any one of the source elements corresponding to the sink element that the level of the sink element contained as an apex in a triangle passed by the wiring among said generated triangles is the lowest for each of the wiring.

Preferably, said wiring design method determines that an edge of said triangle having as an apex only a sink element lower than a level (K+n+1) is an edge which is crossed by one or more wirings (wiring M) each connecting a sink element above the level (K−1) to a source element corresponding to such sink element, and sequentially connects 2 edges which are contained in a same one of said triangles and determined to be crossed by said wiring M each other to derive a route of each of the wirings M.

Wiring Determination Method

This invention also provides a wiring determination method for determining the validity of wiring which connects any one of a plurality of points (sink elements) provided on a plane to any one of a plurality of points (source elements) provided on said plane other than the sink elements with a route lying on said plane comprising the steps of; generating a plurality of virtual triangles having a sink and a source elements as apexes on said plane by Delaunay triangulation method, classifying sink elements contained as an apex in a triangle of said generated triangles which has one of the source elements as an apex into the lowest level (level 1), classifying another sink element contained as another apex in a triangle which has as an apex a sink element of a level K into a level (K+1), said another sink element being other than a level K and (K−1) (K is an integer equal to or greater than 1), and determining that a wiring connecting a sink element of a level K and a source element is valid when the route of such wiring crosses only an edge of said triangle having only sink elements lower than a level (K+n+1) (n is an integer) as the ends thereof and determining that a wiring connecting a sink element of a level K and a source element is invalid when such wiring crosses an edge of said triangle having only sink elements higher than a level (K−1) as the ends thereof.

Recording Medium

This invention provides a first computer readable recording medium recording a program for use in a wiring design apparatus for designing a wiring which connects any one of a plurality of points (sink elements) provided on a plane to any one of a plurality of points (source elements) provided on said plane other than the sink elements with a route lying on said plane, said program causing a computer to execute; a triangle generating step for generating a plurality of virtual triangles having a sink and a source elements as apexes on said plane by Delaunay triangulation method, a level classifying step for classifying sink elements contained as an apex in a triangle of said generated triangles which has one of the source elements as an apex into the lowest level (level 1), and classifying another sink element contained as another apex in a triangle which has as an apex a sink element of a level K into a level (K+1), said another sink element being other than a level K and (K−1) (K is an integer equal to or greater than 1), and a wiring design step for so designing a plurality of wiring routes connecting any one of the sink elements to any one of the source elements corresponding to the sink element that the level of the sink element contained as an apex in a triangle passed by the wiring among said generated triangles is the lowest for each of the wiring.

This invention also provides a second computer readable recording medium recording a program for use in a wiring determination apparatus for determining the validity of wiring which connects any one of a plurality of points (sink elements) provided on a plane to any one of a plurality of points (source elements) provided on said plane other than the sink elements with a route lying on said plane, said program causing a computer to execute; a triangle generating step for generating a plurality of virtual triangles having a sink and a source elements as apexes on said plane by Delaunay triangulation method, a level classifying step for classifying sink elements contained as an apex in a triangle of said generated triangles which has one of the source elements as an apex into the lowest level (level 1), classifying another sink element contained as another apex in a triangle which has as an apex a sink element of a level K into a level (K+1), said another sink element being other than a level K and (K−1) (K is an integer equal to or greater than 1), and a wiring determination step for determining that a wiring connecting a sink element of a level K to a source element is valid when the route of such wiring crosses only an edge of said triangle having only sink elements lower than a level (K+n+1) (n is an integer) as the ends thereof and determining that a wiring connecting a sink element of a level K and a source element is invalid when such wiring crosses an edge of said triangle having only sink elements higher than a level (K−1) as the ends thereof.

Mode of Practicing the Invention

First Embodiment

A first embodiment of this invention is now described hereunder.

While this invention is described hereunder taking an application of this invention to wiring a semiconductor package as an example, this invention may be also applicable to a wide use including a design of a printed circuit, etc.

Computer Network 1

A computer network 1 to which the wiring design method and the wiring determination method of this invention are applied is described hereunder.

FIG. 1 is a diagram showing an example of the configuration of the computer network to which this invention is adapted.

As shown in FIG. 1, the computer network 1 comprises n client computers 10, a communication channel 18 and a server computer 20 (FIG. 1 shows an example where n=1).

Figure 2:
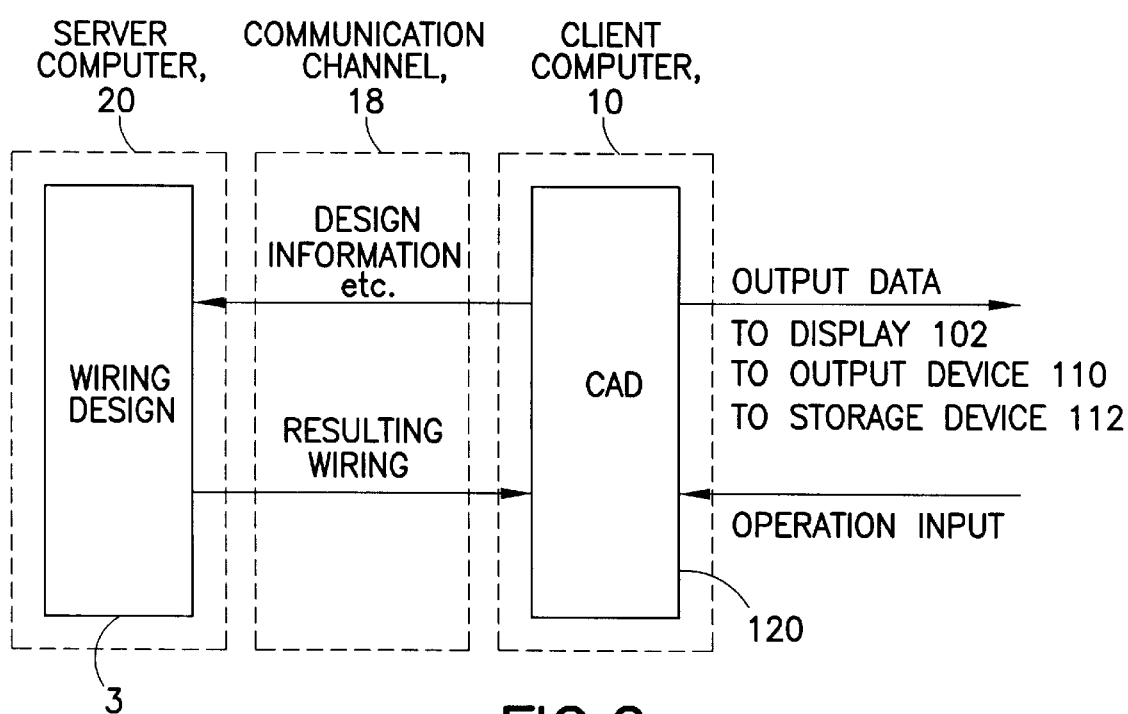
FIG. 2 is a diagram showing an allotment of function between the client computer 10 and the server computer 20.

FIG. 2 is a diagram showing an allotment of function between the client computer 10 and the server computer 20.

As shown in FIG. 2, the client computer 10 executes a CAD (computer aided design) software 120 for effecting a design of a semiconductor chip while the server computer 20 executes a wiring design software 3 for designing wiring between a bonding pad of a semiconductor chip and a pin of a semiconductor package. Incidentally, the wiring design method of this invention may be implemented by a configuration in which a same computer executes the CAD software 120 and the wiring design software 3 besides the configuration shown in FIG. 2.

With these components, the computer network 1 designs a wiring connecting a bonding pad and a pin in a route which does not assume an illegality such as unsuitably many wirings passing between pins, unsuitable detouring around other pin or detouring around the periphery of a pin based on information indicating the position of a bonding pad of a semiconductor chip (pad position information), information indicating the position of a terminal (pin) of a semiconductor package (pin position information) and information indicating a connecting relationship between a bonding pad and a pin (wiring information). The pad position information, the pin position information and the wiring information will be collectively also called a "design information" hereunder.

The design information assumes a data structure which correlates wiring (NET), a bonding pad (Pad) and a pin (Pin) in the form shown in the Table 1 below, for example.

TABLE 1

Example of Design Information

| | |
|---|---|
| NET-A | Pad 1, Pin 20 |
| NET-B | Pad 13, Pin 4 |
| NET-C | Pad 25, Pin 15 |
| NET-D | Pad 11, Pin 94 |
| . | . |
| . | . |
| . | . |

Communication Channel 18

The communication channel 18 includes a LAN, leased data channel, an ISDN channel or a public telephone channel capable of data communication and transmits data between the client computer 10 and the server computer 20.

Client Computer 10

As shown in FIG. 1, the client computer 10 comprises a computer unit 100, a display device 102 such as a CRT display device and a liquid crystal display device, an input device 104, an output device 110 including a printer and a plotter, etc., a storage device 112 such as a hard disk device or a magneto-optic (MO) disk device, and a communication device 114.

Input Device 104

The input device 104 includes a keyboard 106 and a mouse 108, receives information required for designing a semiconductor circuit or modifying the design thereof and information relating to the disposition of pins of a semiconductor package, and outputs them to the computer unit 100 in response to an operation by a user.

Storage Device 112

The storage device 112 stores data including; a CAD software 120 shown in FIG. 2, information inputted via the input device 104, information indicating a semiconductor circuit designed by the CAD software 120, information indicating the disposition of circuits and bonding pads when the designed semiconductor circuit is implemented as an actual semiconductor chip, and information indicating a wiring between the pins and the bonding pads of the semiconductor chip which is transmitted from the server computer 20, and outputs the stored data to the computer unit 100 in response to a request.

Communication Device 114

The communication device 114 includes an Ethernet adapter, a token ring adapter, an FDDI, a TA (terminal adapter) or a modem and transmits data between the client computer 10 and the server computer 20 via the communication channel under the control of the computer unit 100.

Computer Unit 100

The computer unit 100 comprises a CPU, a memory and peripheral circuits thereof and has a function as a so called personal computer or a workstation to control the components of the client computer 10.

Processing of CAD Software 120

The computer unit 100 loads the CAD software 120 into the memory for execution and effects the following processing.

The computer unit 100 designs a semiconductor circuit based on information required for designing a semiconductor circuit inputted via the input device 104, it further designs the disposition of the designed semiconductor circuit and the bonding pads, and outputs them to the display device 120, the output device 110 and the storage device 112.

The computer unit 100 also generates design information indicating the disposition of the bonding pads of the designed semiconductor circuit and connection of individual bonding pad to respective pin of the semiconductor package, and transmits it to the server computer 20 (design information generating process).

The computer unit 100 also displays the resulting wiring between the pins and the bonding pads of the semiconductor package inputted from the server computer 20 in the display device 120, etc., for presentation to the user.

When the resulting wiring displayed in the display device 120, etc., shows an illegality in which connections between pins and bonding pads can not all be wired without crossing (there is no wiring solution), the wiring density between the pins is unnecessarily high even though there is a wiring solution, a rout detours largely, or the route surrounds the periphery of a pin, the user inputs design change information by operating the input device 104 to change the disposition of the semiconductor circuit and the bonding pads for resolving the illegality of the wiring. The computer unit 100 changes the design of the semiconductor circuit and/or the disposition of the circuit and the bonding pads and further generates new design information based on the result of the design to output it to the server computer 20.

Server Computer 20

As shown in FIG. 1, the server computer 20 comprises a computer unit 200, a storage device 202 and a communication device 204.

Storage Device 202

The storage device 202 stores the wiring design software 3, information required for designing wiring between bonding pads of a semiconductor chip and pins of a semiconductor package, and data indicating the resulting wiring, and outputs the stored data to the computer unit 200 in response to a request.

Communication Device 204

The communication device 204 transmits data between the client computer 10 and the server computer 20 via the communication channel 18 under the control of the computer unit 200 in the manner similar to the communication device 114.

Computer Unit 200

The computer unit 200 comprises a CPU, a memory and peripheral circuits thereof in the manner similar to the computer unit 100 and controls the components of the server computer 20.

Processing of the Wiring Design Software 3

The computer unit 200 loads the wiring design software 3 shown in FIG. 2 from the storage device 202 to the memory for execution, it designs wiring connecting the bonding pads of a semiconductor chip to the pins of the semiconductor package based on the design information transmitted from the edge of the client computer 10, it also generates data indicating the presence or absence of a wiring solution and an illegal wiring and what illegal wiring occurs between which bonding pad and which pin, and outputs it to the client computer 10 as a resulting wiring.

The processing of the wiring design software 3 which is executed in the server computer 20 is now described hereunder.

Figure 3:
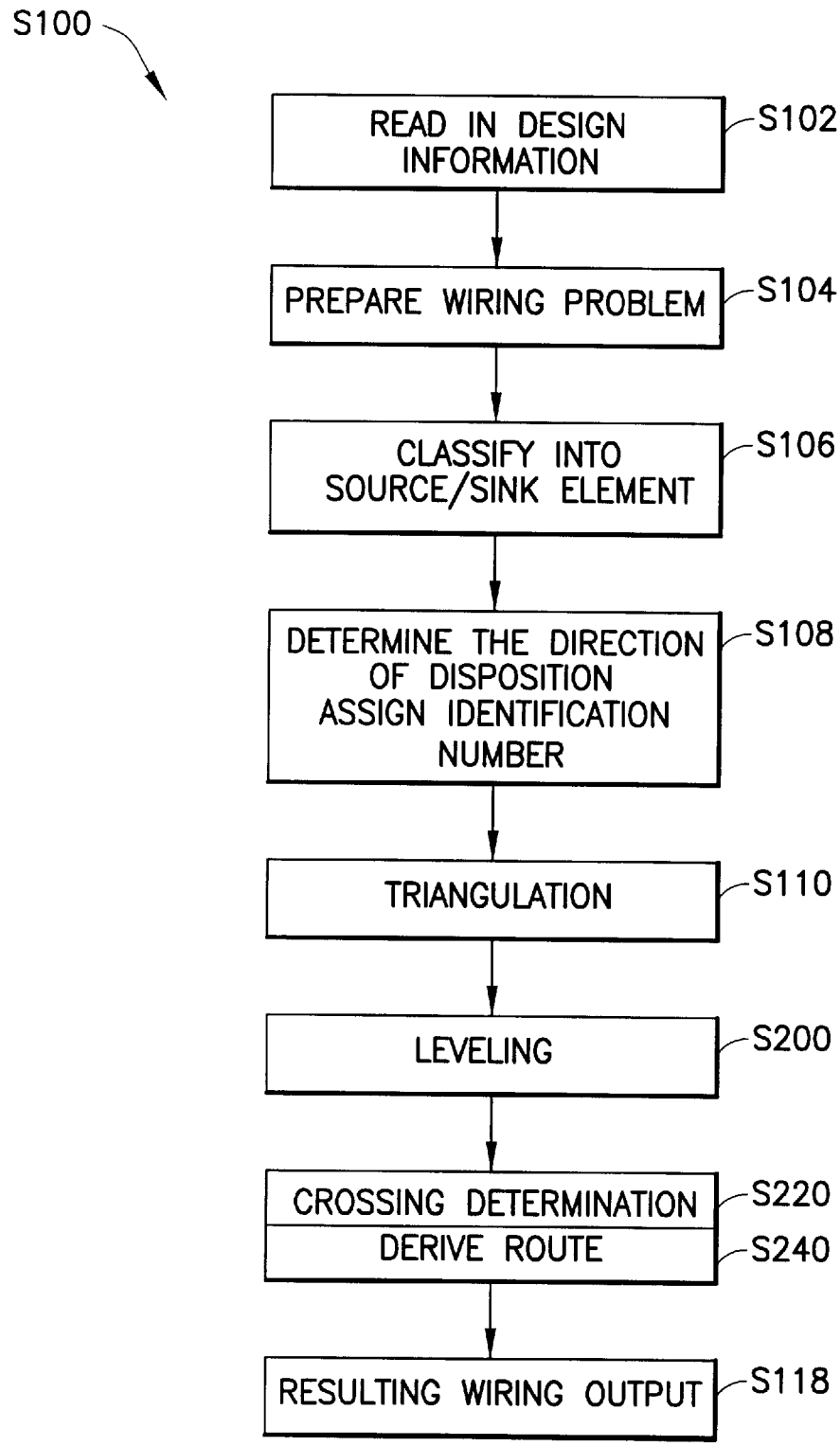
FIG. 3 is a flow chart showing the wiring design process (S100) of the wiring design software 3 shown in FIG. 2 in the first embodiment of this invention.

FIG. 3 is a flow chart showing the wiring design process (S100) of the wiring design software 3 shown in FIG. 2 in the first embodiment of this invention.

As shown in FIG. 3, in step 102 (S120), the wiring design software 3 reads in the design information which the computer unit 200 received from the client computer 10.

In step 104 (S104), the wiring design software 3 analyzes the design information read in, replaces the bonding pads and the pins with points on a wiring plane of a semiconductor package to generate data indicating the positional relationship among them (this data is hereinafter also referred to as "wiring problem", being taken as a problem of obtaining a wiring solution to be solved by the wiring design software 3).

In step 106 (S106), the wiring design software 3 places the points corresponding to the bonding pads and the pins on the semiconductor package of the wiring problem in a source element from which a wiring is taken out and the periphery thereof [when the semiconductor package is a pin grid array (PGA), for example] and classifies the points corresponding to the pins into a sink element in which the wiring is taken.

Incidentally, the name of the source elements and the sink elements is for the purpose of convenience and points corresponding to bonding pads and pins may be conversely named sink elements and source elements, respectively. Furthermore, the name of the sink element and the source element is irrelevant to the direction of a signal.

In step 108 (S108), the wiring design software 3 defines an orientation (direction of a series) in the array of source elements based on information indicating the position of the source elements. The direction of series may be either the clockwise or the counterclockwise direction around the source element if it is unidirectional.

Further the wiring design software 3, for example, assigns identification numbers (STATIC_ID) incrementing by 1 from 0 to the source and the sink elements according to the direction of series of the source elements.

The method of assigning the identification numbers (STATIC_ID) in the process of S108 is now described with reference to FIG. 4 to FIG. 6.

Figure 4:
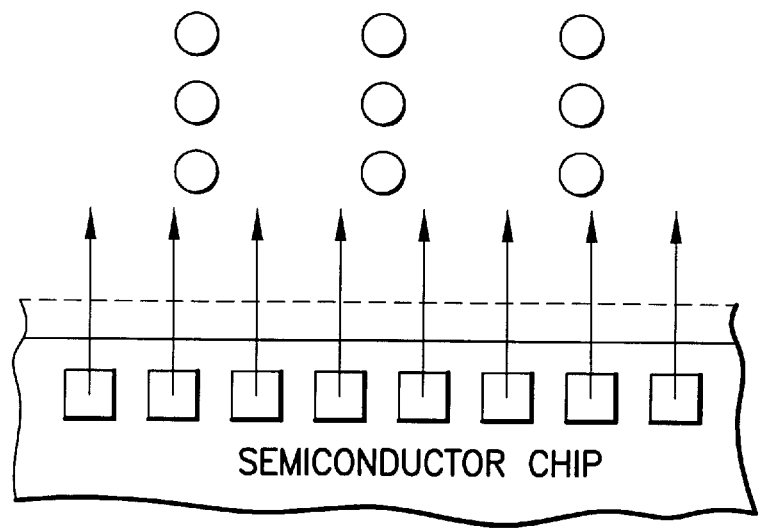
FIG. 4 is the first diagram showing a method of assigning the identification numbers (STATIC_ID) in the process of S108 in FIG. 3.
Figure 5A:
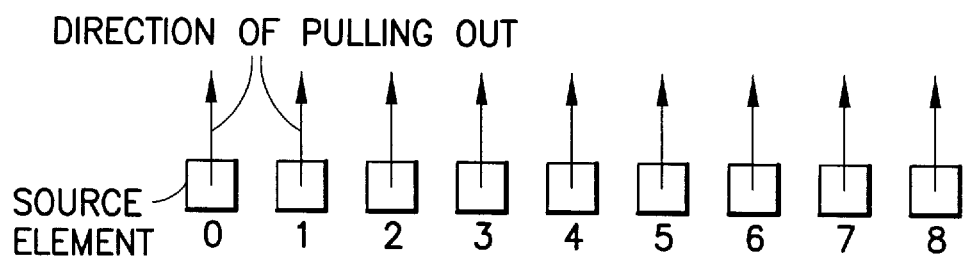
FIGS. 5A and 5B are the second diagram showing a method of assigning the identification numbers (STATIC_ID) in the process of S108 in FIG. 3.
Figure 5B:
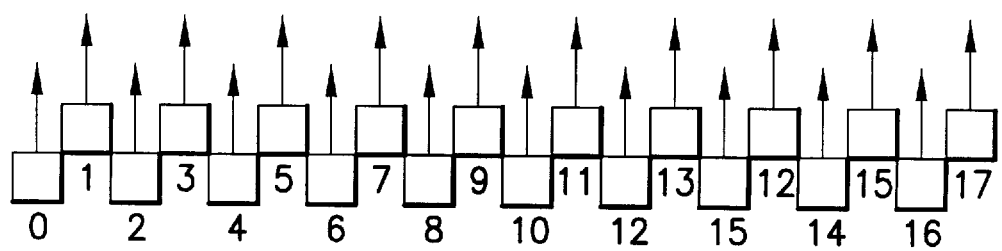
Figure 6:
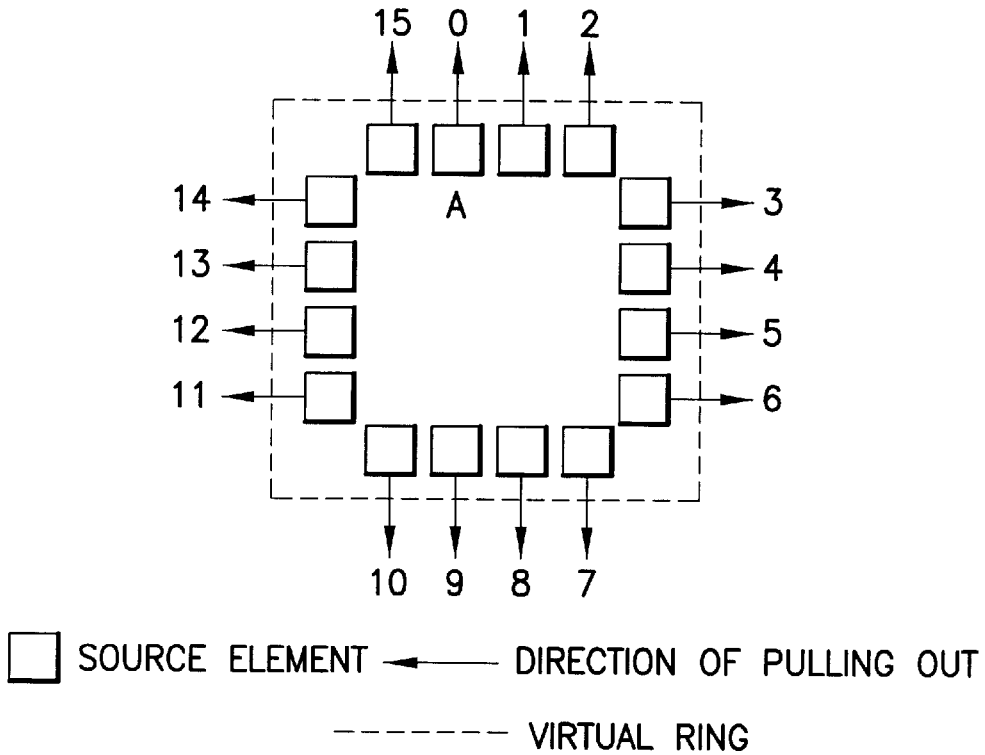
FIG. 6 is the third diagram showing a method of assigning the identification numbers (STATIC_ID) in the process of S108 in FIG. 3.

FIG. 4 to FIG. 6 are the first to the third diagrams showing method of assigning the identification numbers (STATIC_ID) in the process of S108 in FIG. 3.

The bonding pads (source elements) are orderly placed around the semiconductor chip and the direction in which a wiring is pulled out from the bonding pad can be uniquely decided in most cases. Also, there is a case where the direction of pulling out a wiring has been decided beforehand as an explicit pattern (fan out pattern).

As such, the identification numbers assigned to the bonding pads and the pins (sink elements) in the process of S108 has a meaning that it defines the order of the sequence of wirings involved in a wiring problem to be solved when the direction of pulling out a wiring from the bonding pad is predetermined.

As shown in FIG. 4, wirings between bonding pads and pins are pulled out to pins disposed in parallel to the series of the bonding pads around the semiconductor chip which is placed at the middle of the wiring plane of a semiconductor package in most cases (in the case of wiring in PGA package, for example). When there is no illegality in the wiring route such as detouring around a pin, wirings are pulled out from the bonding pads in parallel. A ring (virtual ring) surrounding the bonding pads is now assumed between the bonding pads and the pins as shown by the dotted line in FIG. 4.

While the virtual ring does not particularly play an important role in the wiring design when the bonding pads are disposed in a line on the semiconductor chip as shown in FIG. 5A, it plays an important role when the bonding pads are disposed in a plurality of lines (2 lines) as shown in FIG. 5B.

When the bonding pads are disposed in a line as shown in FIG. 5A, they may be simply assigned identification numbers along the line in clockwise or counterclockwise.

However, in the case shown in FIG. 5A, the identification numbers must not be assigned such that the numbers are assigned in sequence to the right from a bonding pad which is assigned a number STATIC_ID_4 and again assigned in sequence from the left end after returning when the right end is reached. In other words, assignment of discontinuous identification numbers is permitted only to the bonding pads at the ends while assignment of only continuous identification numbers is permitted to other bonding pads in the bonding pads lined in parallel directions.

When the bonding pads are disposed in a plurality of lines as shown in FIG. 5B, the identification numbers are assigned in sequence in the order in which a wiring pulled out from each bonding pad crosses the virtual ring when the virtual ring is traced in a given direction. In assigning the identification numbers when the bonding pads are disposed in a plurality of lines, the same rule is also applied in that assignment of discontinuous identification numbers is permitted only to the bonding pads at the ends while assignment of only continuous identification numbers is permitted to other bonding pads.

In FIG. 5B where a wiring (wiring 4) pulled out from a pad assigned an identification number STATIC_ID_4 passes between the bonding pads assigned the identification number STATIC_ID_3 and STATIC_ID_5 (bonding pads 3 and 5), a wiring solution may not be obtained or an illegal wiring may occur if the wiring 4 does not pass between the bonding pads 5 and 6, for example. An explicit designation of wiring direction (fan out process) is required for such wiring.

When the above described assignment of identification numbers is effected to the bonding pads which are lined along the 4 edges of a semiconductor chip, all bonding pads are uniquely assigned identification numbers as shown in FIG. 6.

Assignment of identification numbers to pins is effected according to a method of assigning the same identification numbers as the corresponding bonding pads, i.e., a method of assigning an identification number STATIC_ID_X to a pin which is connected to a bonding pad X.

Once identification numbers have been assigned to the bonding pads and the pins, the wiring design software 3 reorders the bonding pads in the sequence of the identification numbers to generate source list data.

In step 110 (S110, FIG. 3), the wiring design software 3 generates a virtual triangle (Delaunay triangle) having a source element, a sink element and an inhibited area (an area where it is inhibited to pass a wiring, such as an area beneath the semiconductor chip) as apexes by applying Delaunay triangulation to the source and sink elements contained in the wiring problem.

The edge (triangulated edge) of these Delaunay triangles can be referred to at the apexes. Specifically, it is so devised that all the triangulated edges in which arbitrary source and sink elements are the end points can be referred to by an end point P or a function having the end point P as a parameter.

Figure 7:
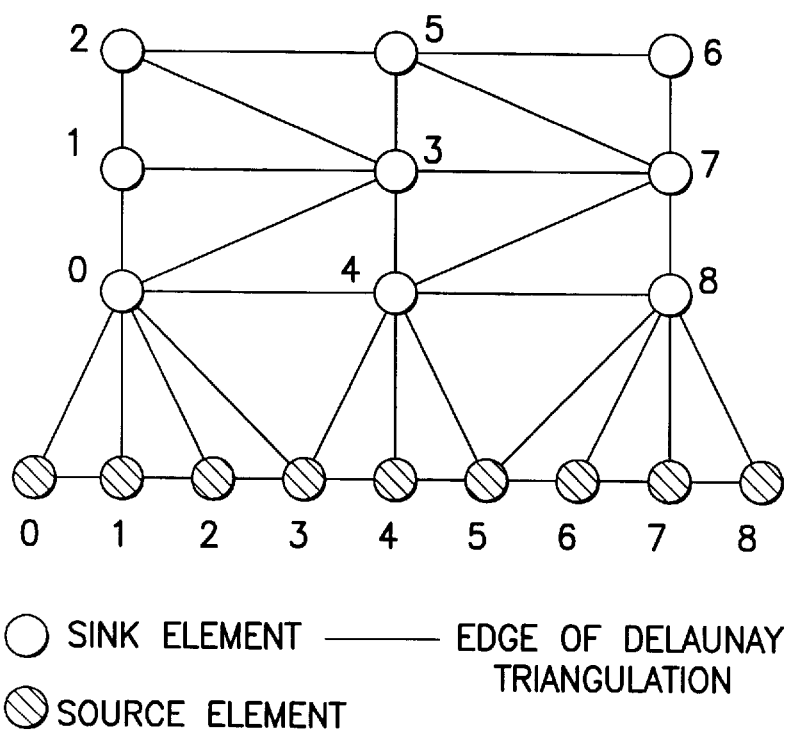
FIG. 7 is a diagram showing a Delaunay triangle obtained by the triangulation process (S110) shown in FIG. 3.

FIG. 7 is a diagram showing a Delaunay triangle obtained by the triangulation process (S110) shown in FIG. 3. In the figures the numerals assigned to an edge, a source element and a sink element give an identification number (STATIC_ID).

When the wiring design software 3 effects a dividing process by Delaunay triangulation with respect to the bonding pads (source elements) disposed in a single line along the periphery of a semiconductor chip and the pins disposed in 3 lines around the semiconductor chip, the Delaunay triangles are generated as shown in, for example, FIG. 7.

In step 200 (S200, FIG. 3), the wiring design software 3 level classifies (leveling) pins using the generated Delaunay triangles.

The Leveling Process is Now Further Described Hereunder

Figure 8:
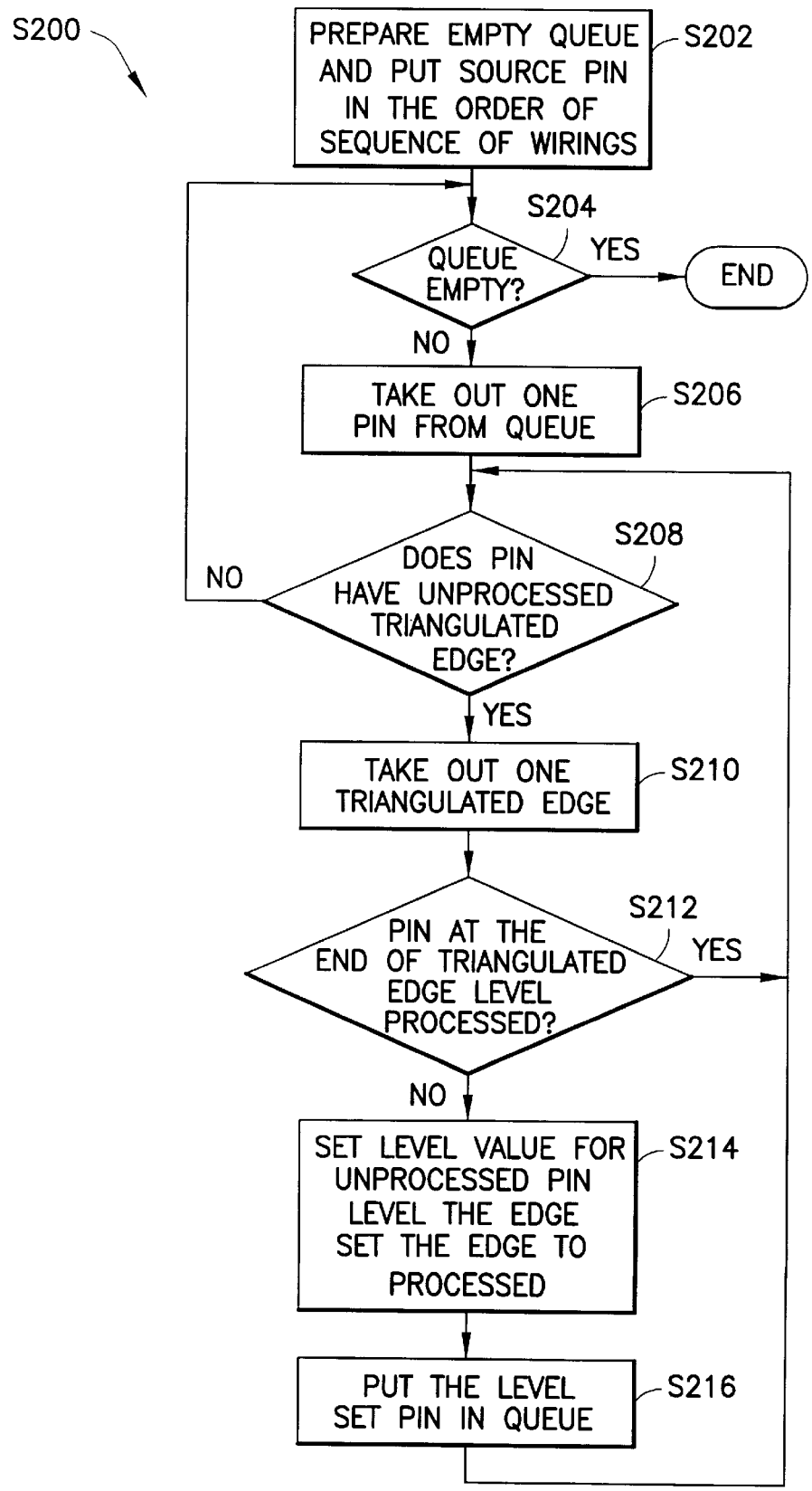
FIG. 8 is a flow chart showing the leveling process (S200) shown in FIG. 3.

FIG. 8 is a flow chart showing the leveling process (S200) shown in FIG. 3.

As shown in FIG. 8, in step 202 (S202), the wiring design software 3 generates an empty queue Q in the form of first-in-first-out which has a data structure for storing a source and a sink elements.

The wiring design software 3 also initializes the level of all bonding pads (source element) in the wiring problem to a level 0 and the level of all pins (sink elements) to an indefinite value (level-1).

The wiring design software 3 further correlates a pin and a bonding pad which have a same identification number each other and queues them as an element P (only a source element, for example, in this step).

In step 204 (S204), the wiring design software 3 determines whether or not a pin and a bonding pad (element P) are queued in the queue Q. When a pin and a bonding pad are not queued (the queue Q is empty), the wiring design software 3 terminates the leveling process while it proceeds to the process of S206 if they are queued.

In step 206 (S206), the wiring design software 3 takes out one pair of a pin and a bonding pad (element P) to have it processed in the leveling process.

In step 208 (S208), the wiring design software 3 determines whether or not there is a triangulated edge having as an end point a pin P which is to be processed in the leveling process in the process of S206 but have not been leveled (unprocessed triangulated edge E). The wiring design software 3 proceeds to the process of S210 if there is an unprocessed triangulated edge E while it returns to the process of S204 if there is none.

In step 210 (S210), the wiring design software 3 takes out a pin which is to be processed in the leveling process and one of unprocessed triangulated edges which has another pin R as an end point.

In step 212 (S212), the wiring design software 3 determines whether or not the pin R contained in the triangulated edge E as an end point has been leveled, i.e., whether or not the level of the pin R is in an infinite value (−1). The wiring design software 3 returns to the process of S208 if the pin R has been leveled while it proceeds to the process of S214 if it has not been leveled.

In step 214 (S214), the wiring design software 3 levels the pin R at the end point of the triangulated edge E taken out in the process of S210 in a level higher than the level of the end point P (P) by one level (P+1; R) and stores the triangulated edge E in correlation with the index value of the triangulated edge E (sum of the levels of pins P and R at the ends; P+R=2P+1).

The wiring design software 3 further re-classifies the triangulated edge E which have the end pins leveled from not-processed to processed.

In step 216 (S216), the wiring design software 3 queues the pin R which has been leveled in the queue Q as an element P.

Figures 9, 10:
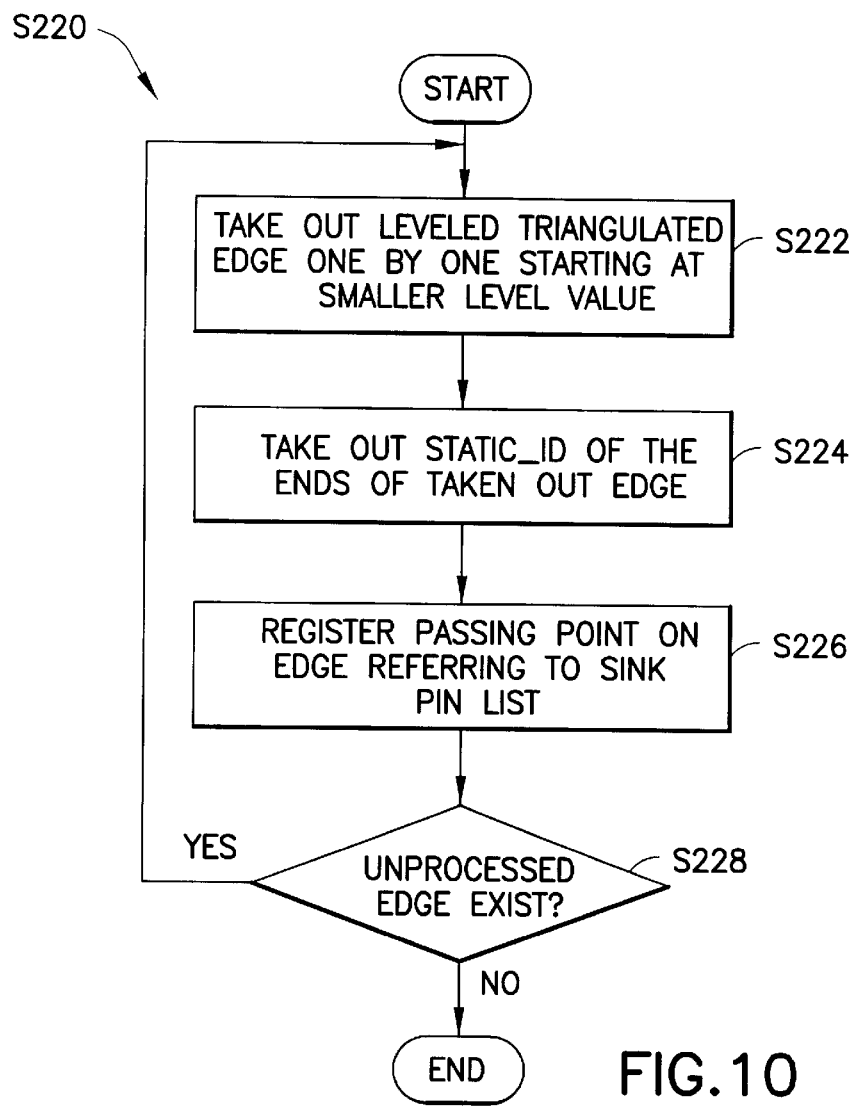
FIG. 9 is a table showing the level of pins (sink elements) disposed as shown in FIG. 7 which are classified into levels.
FIG. 10 is a flow chart showing the crossing determination process shown in FIG. 3 (a part of the process of S220).

FIG. 9 is a table showing the level of pins (sink elements) disposed as shown in FIG. 7 which are classified into levels.

By effecting the above described process with respect to the pins disposed as shown in FIG. 7, the 9 pins 0 to 8 (STATIC_ID_0 to 8) are classified into levels 1, 2, 3, 2, 1, 3, 3, 2, 1. The data which correlates pins to levels as shown in FIG. 9 is also called "sink list data" hereinafter.

In step 220 (S220; FIG. 3), the wiring design software 3 determines which of the triangulated edges is crossed by wirings connecting the bonding pads and the pins. The wiring design software 3 connects triangulated edges which are determined to cross a wiring each other to derive the route of the wirings.

FIG. 10 is a flow chart showing the crossing determination process shown in FIG. 3 (a part of the process of S220).

As shown in FIG. 10, in step 222 (S222), the wiring design software 3 takes out the triangulated edges obtained by Delaunay triangulation as shown in FIG. 7 one by one in sequence beginning at the end pins of a lower level (when the levels of the end pins are not same, one in the lower level).

In step 224 (S224), the wiring design software 3 takes out the identification numbers (STATIC_ID; FIG. 8) of the ends of the triangulated edge taken out.

In step 226 (S226), the wiring design software 3 effects the process of determining crossing of wirings and triangulated edges with reference to the sink list data (FIG. 9).

This process is effected by determining that all wirings connecting pins which have identification numbers intermediate the identification numbers taken out in the process os S224 and are of a higher level than any of the ends of triangulated edges taken out in the process of S222 and bonding pads assigned the same identification numbers as these pins cross the triangulated edges taken out in the process of S222.

When the ends of the triangulated edge E taken out in the process of S222 includes pins 4 and 7 (STATIC_ID_4 and 7), for example, the pins 4 and 7 are in the levels 1 and 2, respectively. Pins having a value intermediate the identification numbers STATIC_ID_4 and 7 of the pins 4 and 7 as their identification numbers are pins 5 an 6 (STATIC_ID_5 and 6) which are in the level 3. Accordingly, the wiring design software 3 determines that the wiring 5 and 6 connecting pins of the identification numbers STATIC_ID_5 and 6 to 0 bonding pads cross the triangulated edge E.

In step 228 (S228), the wiring design software 3 determines whether or not the crossing determination process has been effected for all triangulated edges and returns to the process of S222 if there remains an unprocessed triangulated edge while it terminate the crossing determination process if there remains no unprocessed triangulated edge.

The crossing determination process shown in FIG. 10 is further explained using a specific example.

FIG. 11 to FIG. 15 are the first to fifth figures showing the process of determining crossing between the triangulated edges of Delaunay triangles shown in FIG. 7 and wirings 0 to 8 connecting pins 0 to 8 to bonding pads 0 to 8.

Figure 11:
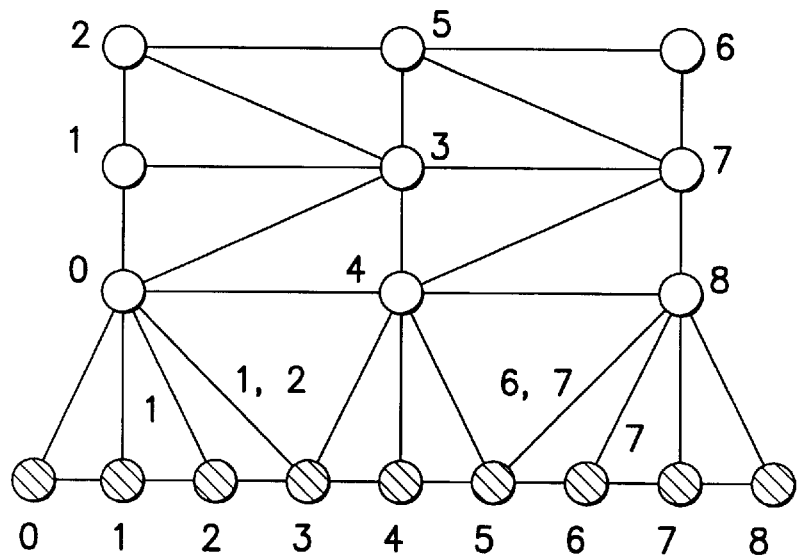
FIG. 11 is the first figure showing the process of determining crossing between the triangulated edges of Delaunay triangles shown in FIG. 7 and wirings 0 to 8 connecting pins 0 to 8 to bonding pads 0 to 8.

According to the flow chart shown in FIG. 10, the crossing determination process is first effected for triangulated edges of Delaunay triangles which have the bonding pads (bonding pads 0 to 8; level 0) and pins 0 to 8 (level 1) as the ends as shown in FIG. 11.

In the example shown in FIG. 11 (FIG. 7), the wiring design software 3 sequentially takes out 11 triangulated edges which have a bonding pad and a pin of the level 1 as the ends to determine crossing.

The wiring design software 3 determines that, among 11 triangulated edges, the 7 triangulated edges having the bonding pad 0 and the pin 0 as the ends (triangulated edge 0, 0), (1, 0), (3, 4), (4, 4), (5, 4), (7, 8), (8, 8) do not cross the wiring because there is no pin of an intermediate identification number.

The wiring design software 3 also determines that the triangulated edges 2, 0 cross the wiring 1, the triangulated edges 3, 0 cross the wiring 2, the triangulated edges 5, 8 cross the wirings 6, 7, and the triangulated edges 6, 8 cross the wiring 7, and registers the wirings crossing the triangulated edges (identification number STATIC_ID of a pin and a bonding pad at the ends of wiring) correlated each other.

The wiring design software 3 registers wirings according to the order of crossings of triangulated edges and wirings, taking prevention of wirings from crossing into consideration, for the triangulated edge which was determined that a plurality of wirings cross each other. Specifically, in the case shown in FIG. 11 where a wiring 6 crosses a triangulated edge 5, 8 at a point near the pin 5 while a wiring 7 crosses at a point away from the pin 5, the wiring design software 3 registers the wiring 6 first and then the wiring 7.

Figure 12:
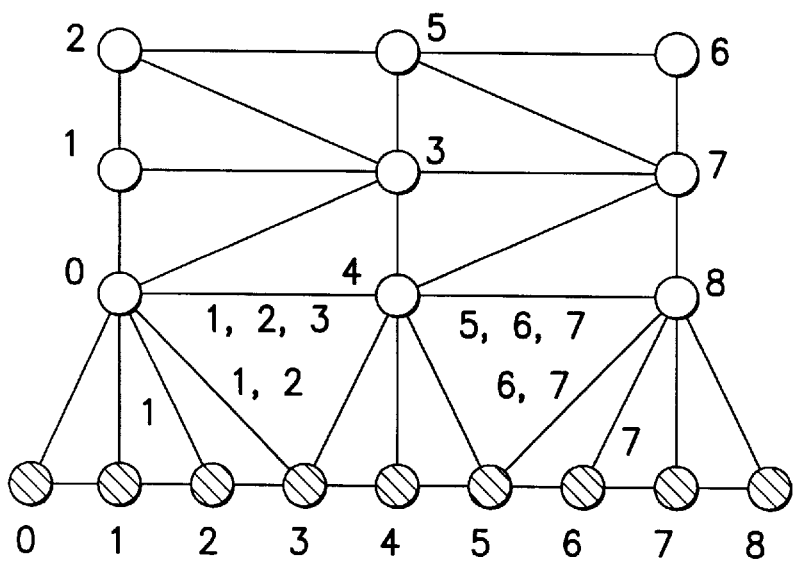
FIG. 12 is the second figure showing the process of determining crossing between the triangulated edges of Delaunay triangles shown in FIG. 7 and wirings 0 to 8 connecting pins 0 to 8 to bonding pads 0 to 8.

As shown in FIG. 12, the wiring design software 3 then determines crossing for triangulated edge which has a pin of level 1 as the end points. The wiring design software 3 determines that a triangulated edge 0, 4 crosses wirings 1, 2, 3 while a triangulated edge 4, 8 crosses wirings 5, 6, 7 and registers these triangulated edges and wirings in correlation each other and taking the order of crossings into consideration as described above.

Figure 13:
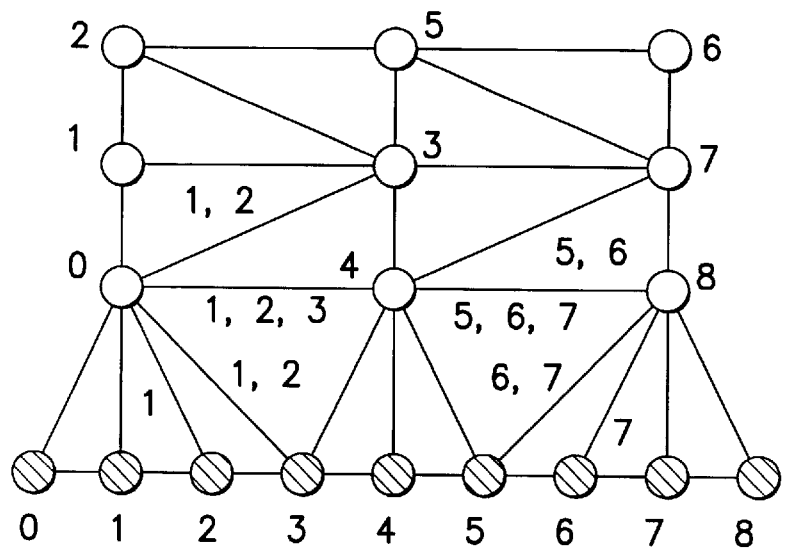
FIG. 13 is the third figure showing the process of determining crossing between the triangulated edges of Delaunay triangles shown in FIG. 7 and wirings 0 to 8 connecting pins 0 to 8 to bonding pads 0 to 8.

As shown in FIG. 13, the wiring design software 3 then determines crossing for triangulated edge which has a pin of level 1 and a pin of level 2 as the end points. The wiring design software 3 determines that a triangulated edge 0, 3 crosses wirings 1, 2 while a triangulated edge 4, 7 crosses wirings 5, 6 and registers these triangulated edges and wirings in correlation each other and taking the order of crossings into consideration.

As shown in FIG. 13, the wiring design software 3 then determines crossing for triangulated edge which has a pin of level 2 as the end points. The wiring design software 3 determines that a triangulated edge 1, 3 crosses the wiring 2 while a triangulated edge 3, 7 crosses wirings 5, 6 and registers these triangulated edges and wirings in correlation each other and taking the order of crossings into consideration.

As shown in FIG. 13, the wiring design software 3 finally determines crossing for triangulated edge which has a pin of level 2 and a pin of level 3 as the end points. The wiring design software 3 determines that a triangulated edge 5, 7 crosses the wiring 6 and registers these triangulated edge and wiring in correlation each other and taking the order of crossings into consideration.

Figure 14:
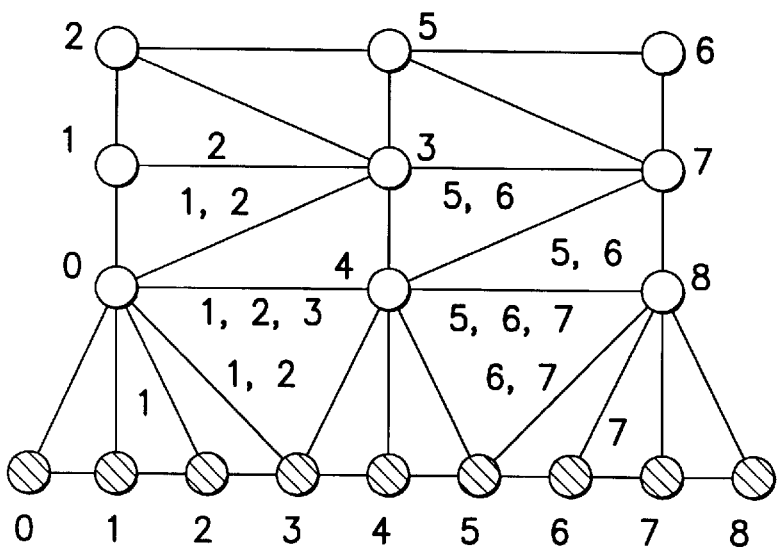
FIG. 14 is the fourth figure showing the process of determining crossing between the triangulated edges of Delaunay triangles shown in FIG. 7 and wirings 0 to 8 connecting pins 0 to 8 to bonding pads 0 to 8.
Figure 15:
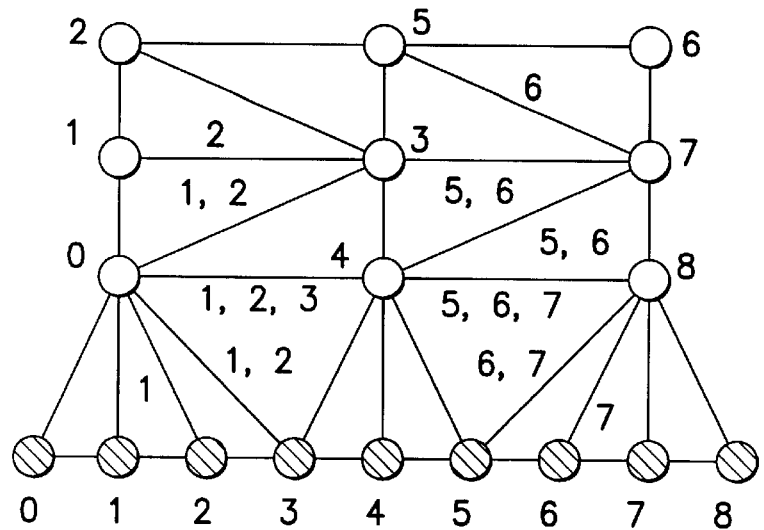
FIG. 15 is the fifth figure showing the process of determining crossing between the triangulated edges of Delaunay triangles shown in FIG. 7 and wirings 0 to 8 connecting pins 0 to 8 to bonding pads 0 to 8.

Similar reasoning is also applied by the wiring design software 3, with reference to FIG. 14 and FIG. 15.

It is, however, necessary in the processes of crossing determination and route deriving to detect a redundancy (illegality) such as turning around and detouring to exclude registration of such wiring route in the process of crossing determination.

A method of excluding registration of such redundant wiring route is described hereunder using a specific example.

Figure 16:
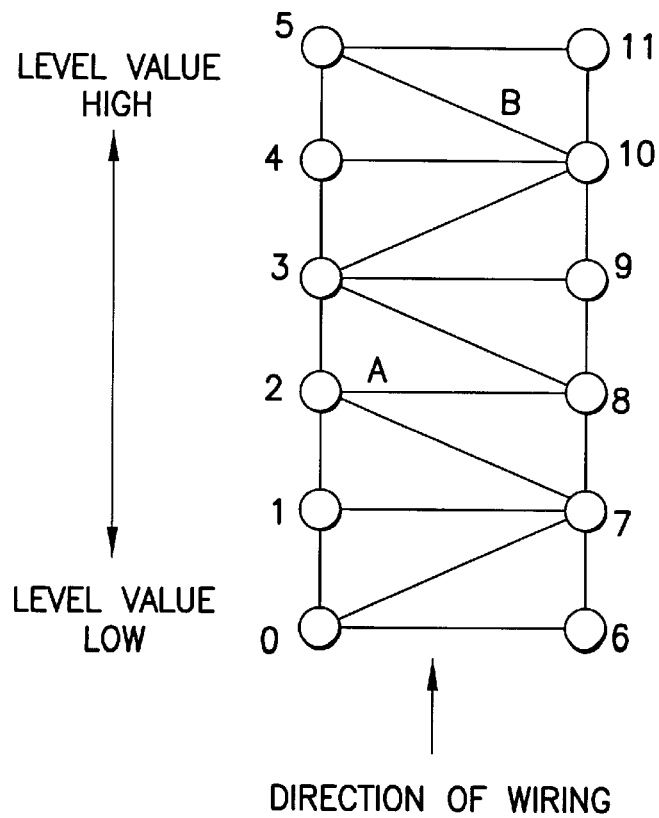
FIG. 16 is a diagram showing an example of pin disposition which causes a redundant wiring route.

FIG. 16 is a diagram showing an example of pin disposition which causes a redundant wiring route.

Figures 17, 18:
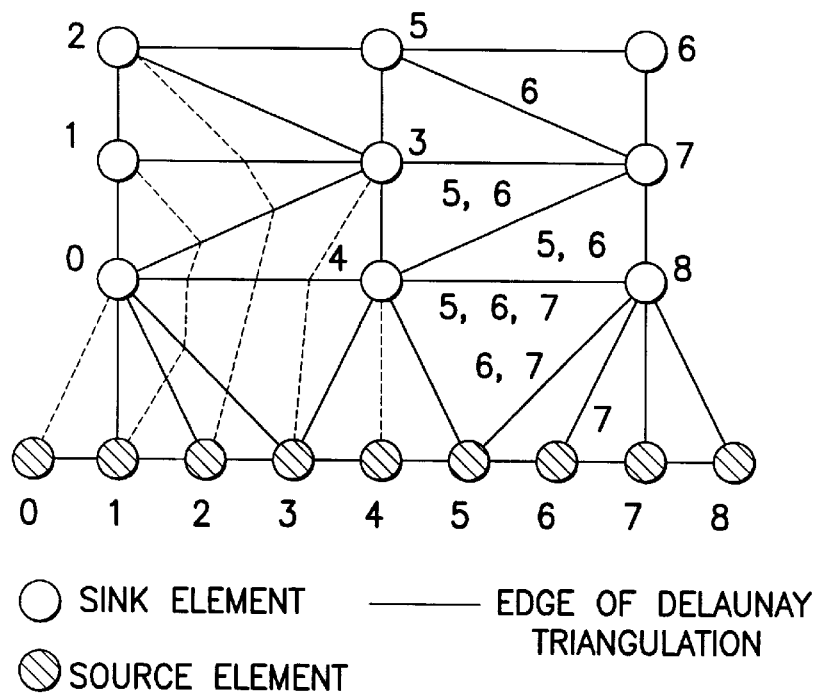
FIG. 17 is a table showing sink list data obtained when a leveling process is applied to the pin disposition shown in FIG. 16.
FIG. 18 is the first diagram showing an example of route deriving process shown in FIG. 3.

FIG. 17 is a table showing sink list data obtained when a leveling process is applied to the pin disposition shown in FIG. 16.

When a leveling process in S200 is applied to the pin disposition shown in FIG. 16, the sink list data shown in FIG. 17 is obtained.

According to the crossing determination process as described in the above, wirings to pins 3 to 7 (wirings 3 to 7) will be registered here for the triangulated edge A, as shown in FIG. 16. However, it is found that a large redundancy is caused in wiring when the triangulated edge A crosses the wiring 6 while the pins at the ends of the wiring A are classified into level 3. It is also found that the triangulated edge A may possibly cross the wiring 7 in order to avoid crossing other wirings while a redundancy may be possibly caused in the wiring 7 when the triangulated edge A crosses the wiring 7.

Similarly, while the wirings 6 to 9 will be registered for the triangulated edge B shown in FIG. 16, it is determined that a redundancy is apparently caused if the triangulated edge 6,7 assumes a route passing the triangulated edge B, for example.

Such possible occurrence of redundancy can be determined by comparing the level of pins at the ends of a triangulated edge with the level of a pin to which the wiring is connected. Specifically, the wiring 6 is connected to the pin 6 of level 1 and the wiring 7 is connected to the pin 7 of level 2 while the pins at the ends of the triangulated edge A are in the level 3 and the pins at the ends of the triangulated edge B are in the levels 4, 5. In other words, when the level of pins at the ends of a triangulated edge (when the levels of pins at the ends are not same, a pin of the lower level) is higher than the level of a pin to which the wiring is connected, it can be determined that there is a high possibility in which a redundancy is caused in the wiring crossing this triangulated edge.

Therefore, exclusion of registration of a redundant wiring can add a condition that "a wiring to a pin which is no higher than a level x is registered only for a triangulated edge having pins which are no higher than a level (x-n; x and n are an integer) as the ends" to the crossing determination process.

By making the value of N in this condition adjustable, the flexibility and the usage of the wiring design method of this invention can be expanded.

When there is a wiring which does not satisfy the condition of excluding registration of a wiring in the design information, the user can be notified of which wiring, i.e., the positions of a bonding pad and a pin, is to be corrected to result in a wiring which is free from redundancy to help the user change the design by causing the wiring design software to notify the client computer 10 of information relating to such wiring.

Figure 19:
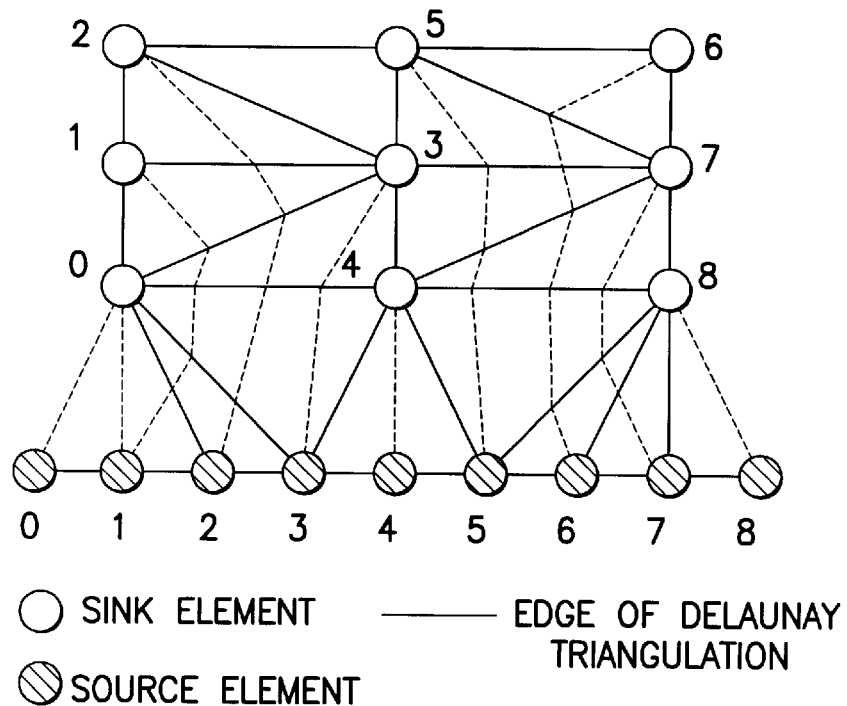
FIG. 19 is the second diagram showing an example of route deriving process shown in FIG. 3.

FIG. 18 and FIG. 19 are the first and the second diagrams showing an example of route deriving process shown in FIG. 3.

When the crossing determination process has been completed as described in the above, the wiring design software 3 connects triangulated edges each other which were determined to cross each of the wirings 0 to 8 connecting each of the pins 0 to 8 to each of the bonding pads 0 to 8, taking the order of crossings of triangulated edges and wirings into consideration, to derive routes of the wirings 0 to 8 which do not cross each other as shown by the dotted lines in FIG. 18 and FIG. 19.

The Route Deriving Process is Further Described

Figure 20:
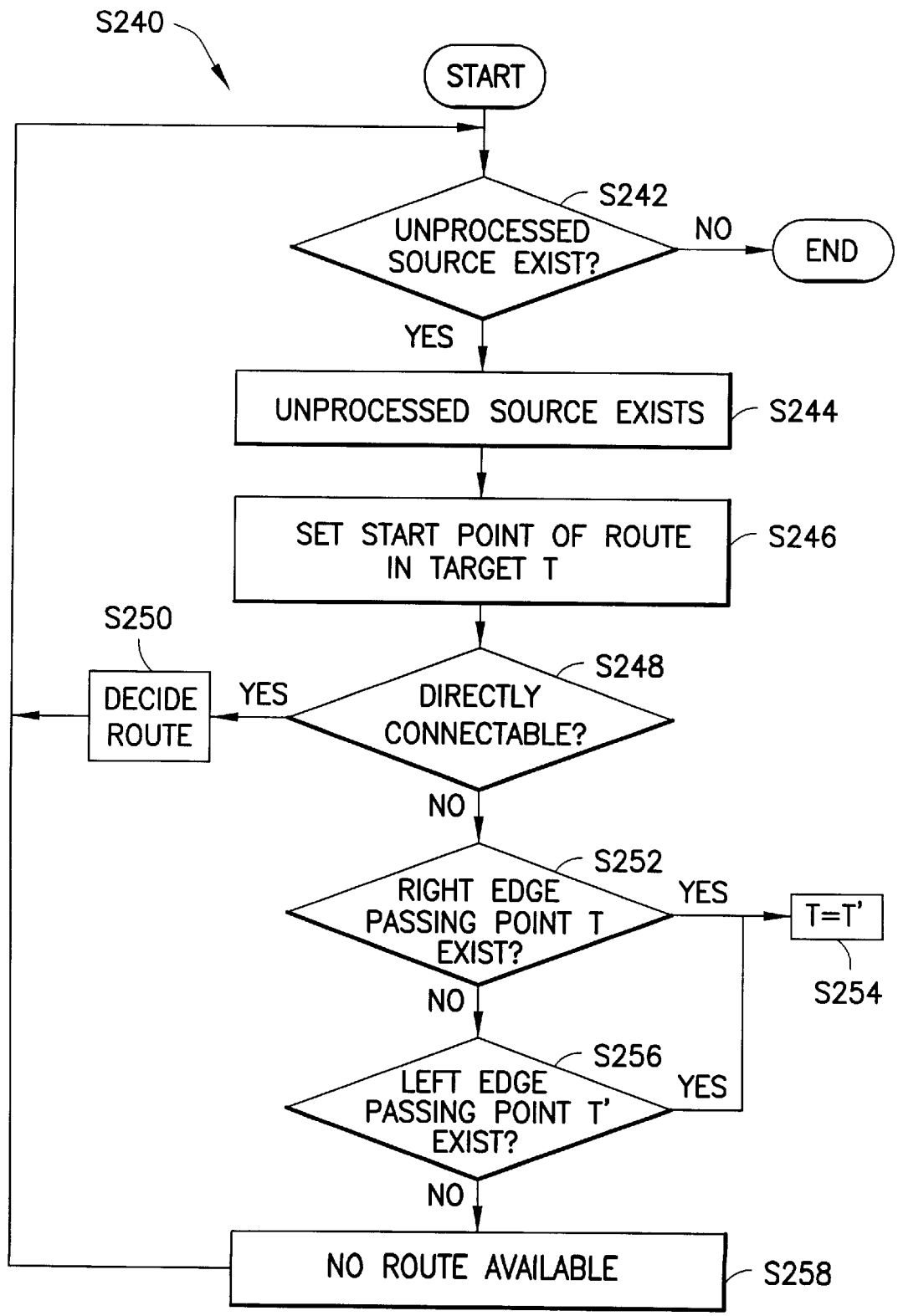
FIG. 20 is a flow chart showing the route deriving process (S240) shown in FIG. 3.

FIG. 20 is a flow chart showing the route deriving process (S240) shown in FIG. 3.

As shown in FIG. 20, in step 242 (S242), the wiring design software 3 determines whether or not there is an unprocessed source element (bonding pad) for which the deriving process of wiring route has not been completed. The wiring design software 3 proceeds to the process of S244 if there is an unprocessed bonding pad while it terminates the process if there is none.

In step 244 (S244) and step 246 (S246), the wiring design software 3 sets unprocessed bonding pads to a subject (target T) of the route deriving process.

In step 248 (S248), the wiring design software 3 determines whether or not a pin connecting to a bonding pad which is deemed to be a target T is in the level 1 and can be directly wired without crossing a triangulated edge. The wiring design software 3 proceeds to the process of S250 if the bonding pad and the pin can be directly connected while it proceeds to the process of S252 if they can not be directly connected.

When the crossing point of a wiring and a triangulated edge is a target T, the wiring design software 3 determines whether or not the crossing point (target T) can be directly connected to a pin in the process of S248 and proceeds to the process of S250 if they can be connected while it proceeds to the process of S252 if they can not be connected.

In step 250 (S250), the wiring design software 3 decides the wiring route so as to directly connect a crossing point of a bonding pad of target T or a wiring and a triangulated edge to a corresponding pin.

When the target T is a crossing point of a triangulated edge and a wiring, the wiring design software 3 determines in step 252 (S252) whether or not a wiring proceeding from a bonding pad to a pin passes a triangulated edge having an end point of the target T lying to the right of the crossing point (right edge) as one of the end points (whether or no a right edge passing point T' exists). If the right edge passing point exists, the wiring design software 3 takes out the right edge passing point T' and proceeds to the process of S254, otherwise it proceeds to the process of S256.

When the target T is a crossing point of a triangulated edge and a wiring, the wiring design software 3 determines in step 252 (S252) whether or not a wiring proceeding from a bonding pad to a pin passes a triangulated edge having an end point of the target T lying to the left of the crossing point (left edge) as one of the end points (whether or no a left edge passing point T' exists). If the left edge passing point exists, the wiring design software 3 takes out the left edge passing point T' and proceeds to the process of S254, otherwise it proceeds to the process of S256.

In step 254 (S254), the wiring design software 3 deems the right edge passing point T' or the left edge passing point T' taken out in the process of S252 or S256 to be a next target T.

In step 258 (S258), the wiring design software 3 determines that there is no route connecting a bonding pad to be processed and a pin corresponding to this bonding pad and stores to that effect, and then proceeds to the route deriving process of wiring for connecting a next bonding pad and a corresponding pin.

In step 118 (S118; FIG. 3), the wiring design software 3 outputs the resulting wiring obtained by the processes of S102 to S110, S200 and S220 to the client computer 10 or the storage device 202.

Operation of Computer Network 1

The operation of the computer network 1 is now described hereunder.

When the user effects an input operation to the client computer 10, the CAD software of the client computer 10 designs a circuit of a semiconductor chip in response to the operation by the user, prepares design information indicating a pin disposition of a semiconductor package, disposition of bonding pads of a semiconductor chip, and connecting relationship between the bonding pads of the semiconductor chip and the pins of the semiconductor package, and sends it to the server computer 20 via the communication channel 18.

In the server computer 20, the wiring design software 3 effects the process of generating a wiring problem, the process of classifying source and sink elements, the process of assigning identification numbers, the process of triangulation, the process of leveling (level classify), the process of crossing determination, and the process of deriving route with respect to the design information from the client computer 10 to design a wiring connecting pins to bonding pads.

Figure 21:
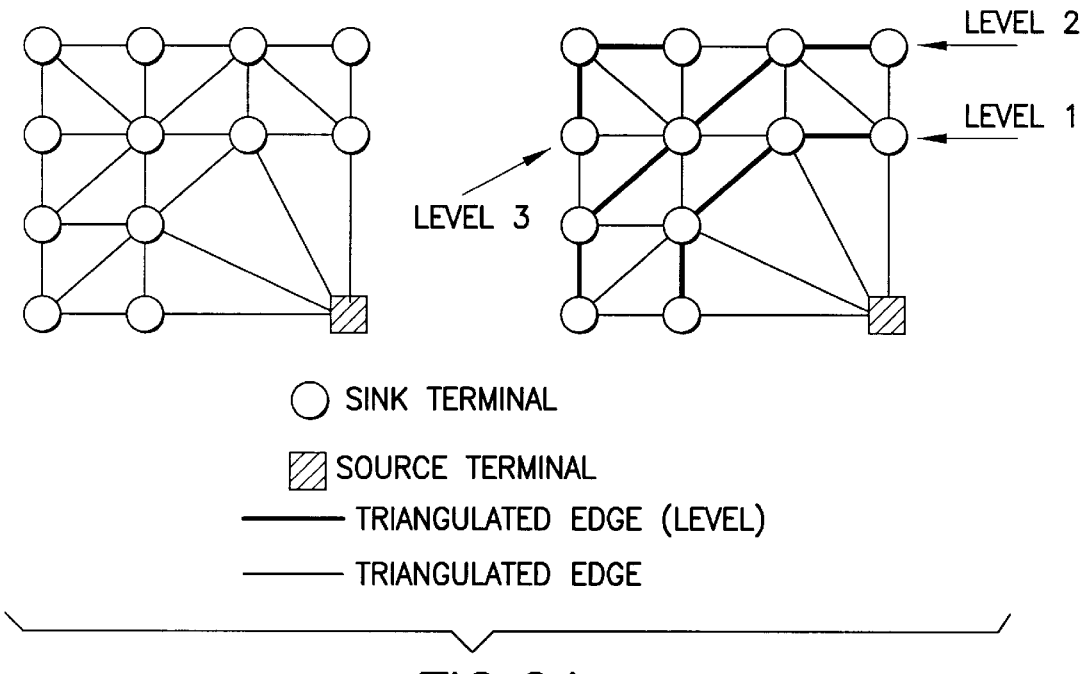
FIG. 21 is a diagram showing an example of the processes of triangulation and leveling according to the wiring design method of this invention.

FIG. 21 is a diagram showing an example of the processes of triangulation and leveling according to the wiring design method of this invention. The pin disposition shown in FIG. 21 to FIG. 24 are different from that in FIG. 7, etc.

Specifically, when the wiring design software 3 reads in the design information and effect the processes of generating a wiring problem, classifying source/sink elements and assigning identification numbers (FIG. 3; S102 to S108), it triangulates between the bonding pads and the pins as shown in the left side of FIG. 21 (FIG. 3; S110), and further levels the pins as shown in the right side of FIG. 21 (FIG. 3; S200).

Figure 22:
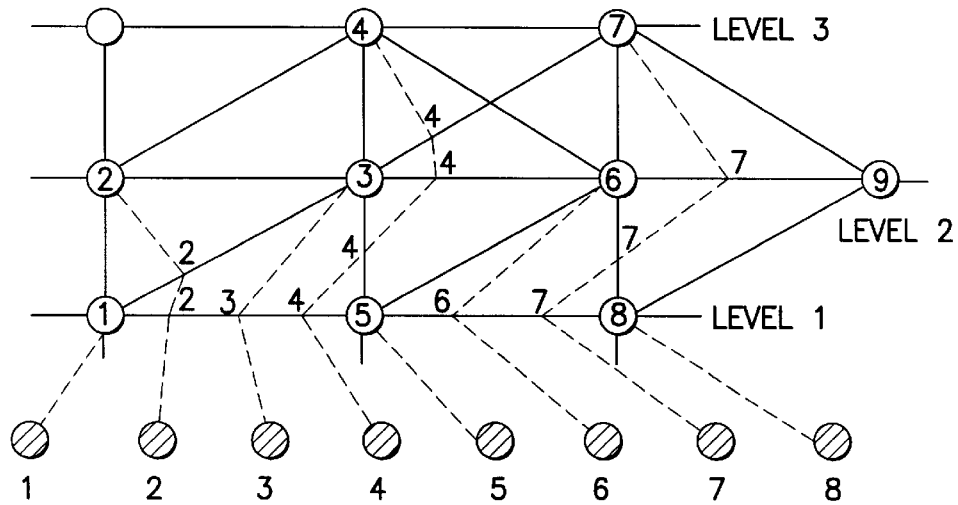
FIG. 22 is a diagram showing an example of the processes of crossing determination and route derivation according to the wiring design method of this invention.

FIG. 22 is a diagram showing an example of the processes of crossing determination and route derivation according to the wiring design method of this invention.

Figure 23:
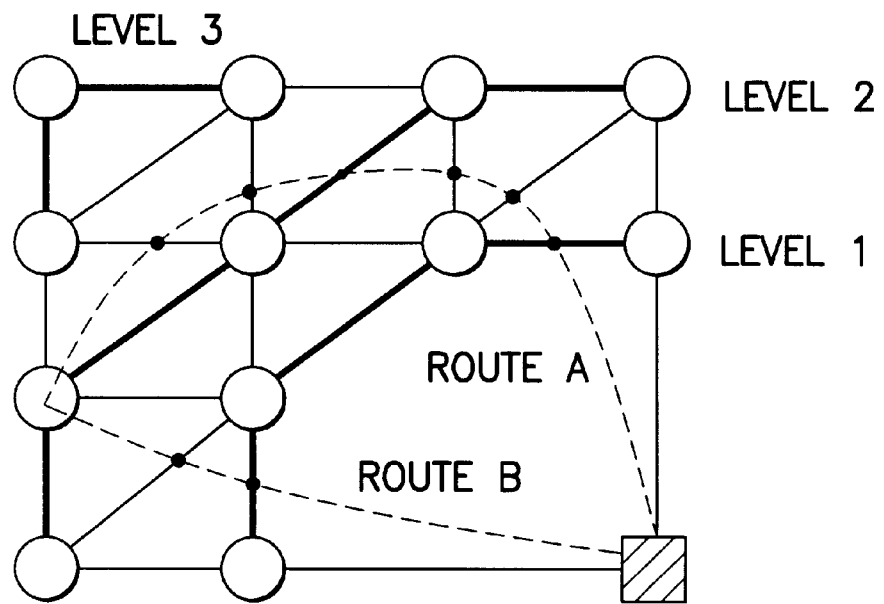
FIG. 23 is a diagram showing an example of a redundant (illegal) wiring and a normal wiring.

FIG. 23 is a diagram showing an example of a redundant (illegal) wiring and a normal wiring. It also shows a case where the wiring design software 3 determines that the wiring connecting a pin of a level K is redundant (illegal) if it crosses a triangulated edge having a pin higher than a level (K-1) as an end point (n=0).

The wiring design software 3 then effects the processes of crossing determination and route derivation (FIG. 3; S220). The redundant wiring route shown as a route A in FIG. 23 is eliminated and only a normal wiring route shown as a route B having no redundancy is derived by the processes of crossing determination and route derivation.

Figure 24:
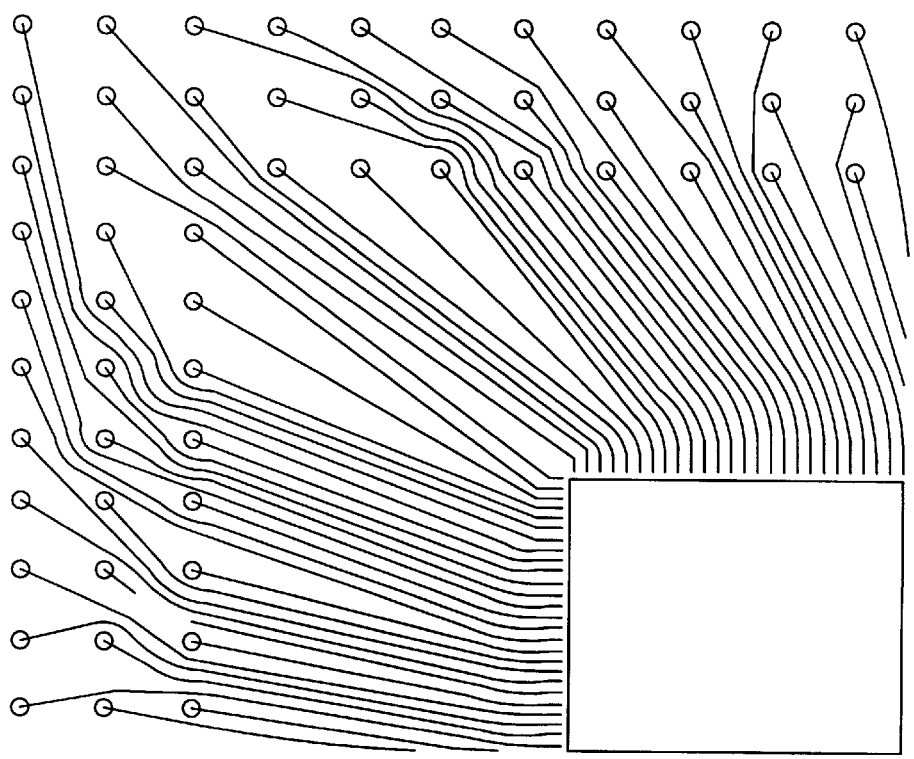
FIG. 24 is a diagram showing a wiring designed by the wiring design method of this invention.

FIG. 24 is a diagram showing a wiring designed by the wiring design method of this invention.

When all wirings have been wired without redundancy (illegality), the wiring design software 3 sends the result of the wiring design as shown in FIG. 24 to the client computer 10 while it sends information specifying a wiring associated with a redundancy (specifying a wiring connecting which bonding pad to which pin) to the client computer 10 via the communication channel 18 if a redundancy is caused in any of wirings (FIG. 3; S118).

The client computer 10 displays the result of the wiring design or information relating to a redundant wiring transmitted from the server computer 20 in the display device 102 for presentation to the user.

When information relating to a redundant wiring is sent from the server computer 20, the user changes the position or the connecting relationship between a bonding pad and a pin for design change so as to remove the redundancy of the wiring.

Alternative Embodiment

While the method has been described on the assumption that all pins of a semiconductor package are wired (100% net assigned), the wiring design method given as the first embodiment can be adapted by analyzing a wiring problem to a case where there is a pin to which a wiring is not connected and to a case where there is a pin on the semiconductor package to which a wiring is not connected (not 100% net assigned) by analyzing a wiring problem and assigning a temporary identification number to a pin to which a wiring is not connected.

A temporary identification number is assigned, when there are pins assigned identification numbers STATIC_ID_3 and 7 to which a wiring is connected, for example, by assigning an identification number STATIC_ID_4 to a pin between these pins to which a wiring is not connected (not net assigned).

Also, only by satisfying a condition that source elements are surrounded by sink elements and wirings are pulled out from the center of the periphery, the wiring design method given as the first embodiment may be applied to derivation of one stroke route connecting more than 2 terminals net only by modifying the way of registering the passing points on a Delaunay triangulated edge.

Specifically, registration of passing points of a route for which wiring more than 2 terminals net is required can be implemented by picking up all level values of wired sink elements and registering within the range of the maximum value of the levels associated to the sink elements. Connection of route can be also implemented by modifying the method so as to connect a wiring to one sink element and then to the next sink element with a limited modification.

Effect of Wiring Design Method Given as First Embodiment

As described above, the wiring design method of this invention can determine whether or not a redundancy is caused in the wiring in the stage of determining a crossing of a triangulated edge and a wiring. Accordingly, information relating to a redundant wiring can be obtained before the entire wiring design is completed, in contrast to the conventional wiring design method, so that the time interval between a wiring design and a design change can be greatly shortened.

Also, in the wiring design method of this invention, the processing load is much less than the conventional wiring design method because wiring can be designed by determining a crossing of each wiring and a triangulated edge and connecting crossing triangulated edges each other.

Accordingly, the wiring can be designed in a time one several tenths of time required in the conventional wiring design method according to the wiring design method of this invention when compared with a computer having a same processing capability.

Because the processing load in the wiring design method of this invention only increases proportionally to the number of triangulated edges, increase of the processing load and the data quantity required for processing are much less than the conventional wiring design method even when a very complex wiring design is done.

Accordingly, the more complex the wiring is, the shorter the processing time required for the wiring design is according to the wiring design method of this invention when compared to the conventional wiring design method.

The wiring design method of this invention can also eliminate a wiring which assumes turning around.

Also, because the wiring design method of this invention can detect existence of a pin which can be connected only by a detouring wiring and notify the user to that effect at the same time in the stage of crossing determination process, the method can move to a design change at an early stage of the wiring design.

Accordingly, the time cycle between a design change of a semiconductor package and solution of a wiring problem can be shortened thereby greatly shortening the entire time required for designing a semiconductor device according to the wiring design method of this invention.

Second Embodiment

The second embodiment of this invention is now described hereunder.

As described in the first embodiment, the wiring design method of this invention determines that a triangulated edge having identification numbers (STATIC_ID) p, q assigned to the pins at the ends crosses a wiring connecting to a pin r (p<r<q) to derive a wiring route.

Figure 25:
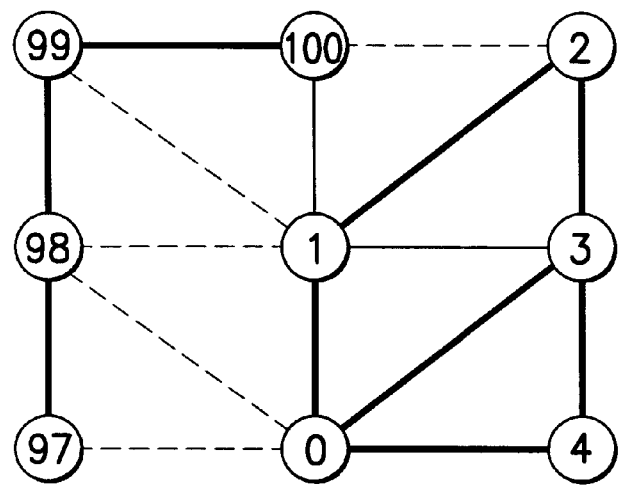
FIG. 25 is a diagram showing an example of a re-entrant portion of a semiconductor package.

FIG. 25 is a diagram showing an example of a re-entrant portion of a semiconductor package.

On the other hand, when identification numbers 0 to 100 are assigned to 101 pins of the semiconductor package, a re-entrant portion is in advent in which a portion assigned an identification number first is adjacent to a portion assigned an identification number last, specifically, a portion in which pins assigned identification numbers STATIC_ID_0, 1, 2 and pins assigned identification numbers STATIC_ID_97, 98, 100 share a triangulated edge.

The wiring design method given as the first embodiment can not be applied as it is to such re-entrant portion in which a pin having identification number near the first number is adjacent to a pin having identification number near the last number.

While the pin assigned identification numbers STATIC_ID_97 and the pin assigned identification numbers STATIC_ID_0 are at the end points of the triangulated edge in the example shown in FIG. 25, for example, it can not be determined by the wiring design method given as the first embodiment that the triangulated edge 97, 0 crosses the wirings 98 to 100 which connect the pins assigned identification numbers STATIC_ID_98, 99, 100.

Therefore, it is impossible to set a route of the wiring 98 to 100 on the triangulated edge 97, 0 resulting in an expedience such as occurrence of unnecessary offset in the wirings.

A wiring design method which can dissolve such expedience occurring in the re-entrant portion is described in the second embodiment.

Figure 26:
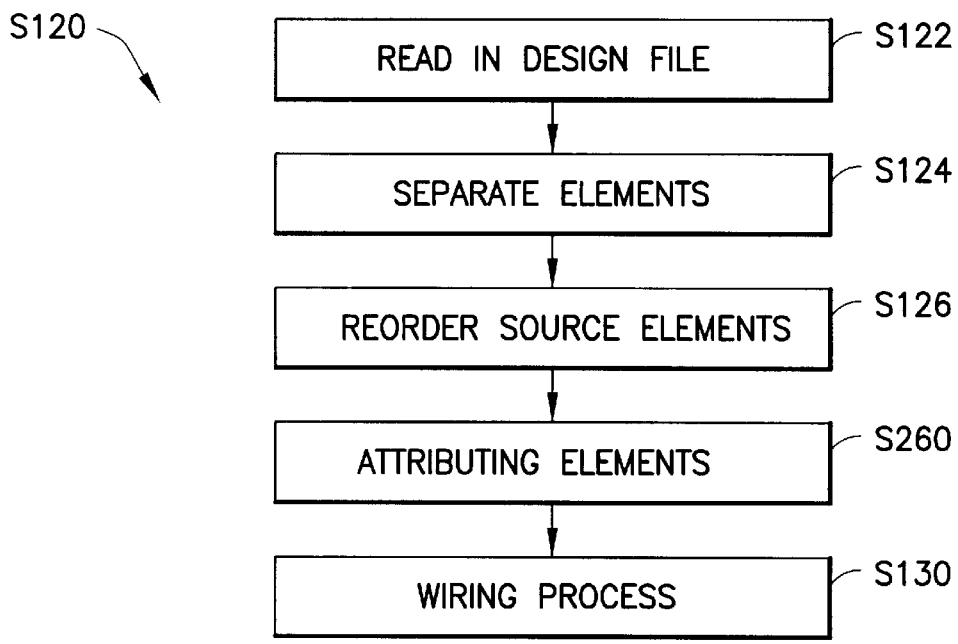
FIG. 26 is a flow chart showing an example of a re-entrant portion of a semiconductor package.

FIG. 26 is a flow chart showing a wiring design process which the wiring design software 3 (FIG. 2) effects on a re-entrant portion in the second embodiment.

As shown in FIG. 26, the wiring design software 3 reads in the design information S120 sent from the client computer 10 in step 122 (S122) in the manner similar to the process of S102 shown in FIG. 3.

In step 124 (S124) and step 126 (S126), the wiring design software 3 effects the processes of generating a wiring problem, classifying the bonding pads and pins into source and sink elements, assigning identification numbers to the bonding pads and the pins, reordering the order of the bonding pads, generating the source list data, triangulating and leveling in the manner similar to the processes of S104 to S110, and S200 shown in FIG. 3.

In step 260 (S260), the wiring design software 3 divides pins involved in the wiring problem into 3 groups and effects an attribute classifying process for assigning an attribute to a pin included in each group.

Specifically, the wiring design software 3 gives to all pins which are assigned consecutive identification numbers beginning at 0 and possibly contained as an apex in a same Delaunay triangle containing a pin which is assigned an identification number near the last number an attribute (ReEntrantLower) to the effect that they are included in the first group.

Also, all pins which are assigned consecutive identification numbers continuing down to the last number and possibly contained as an apex in a same Delaunay triangle containing a pin which is assigned an identification number near the first number are given an attribute (ReEntrantUpper) to the effect that they are included in the last group.

The wiring design software 3 gives to pins not included in any of these groups an attribute (Normal) to the effect that they are included in a normal group.

The attribute classifying process is now further described.

Figure 27:
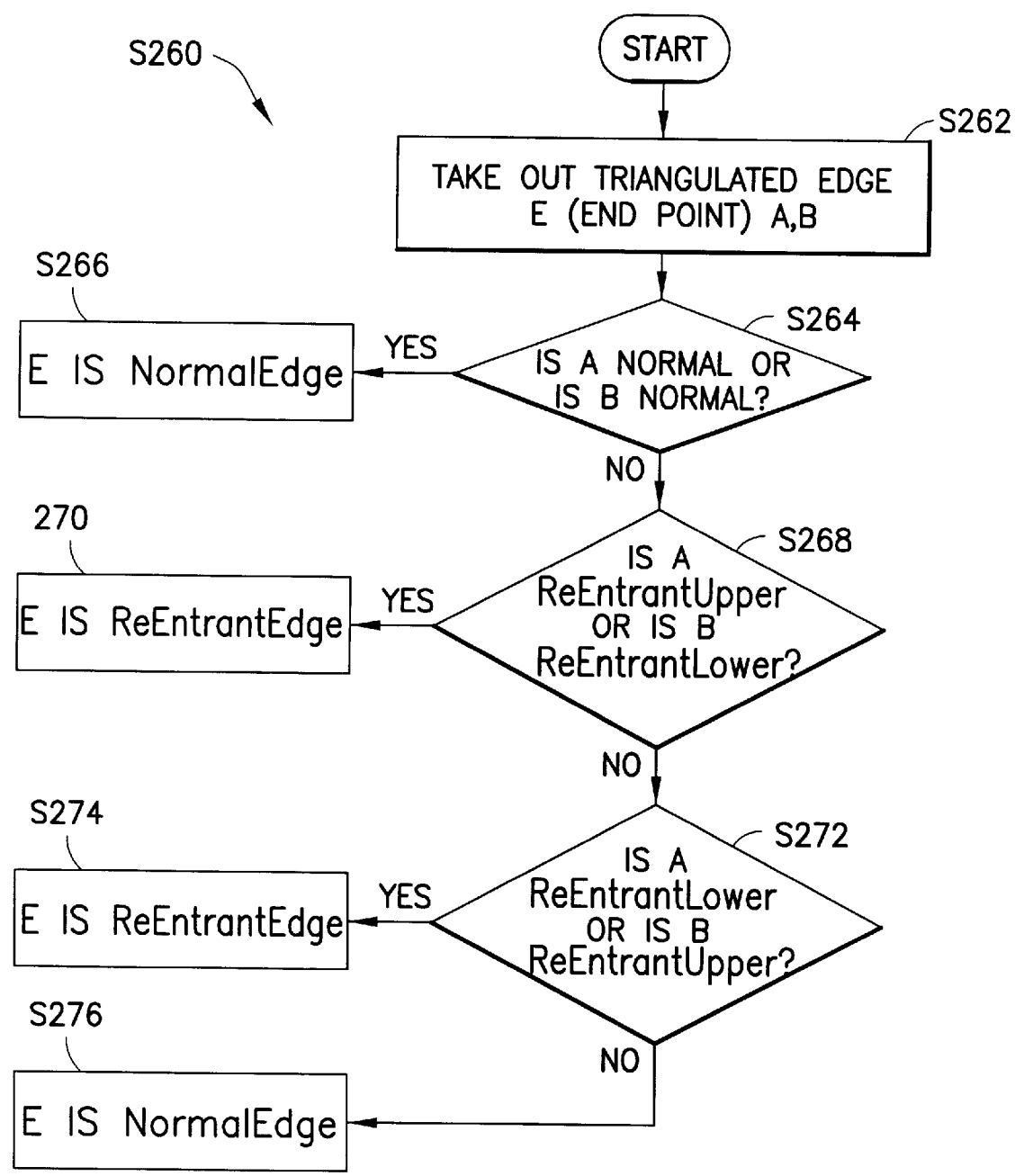
FIG. 27 is a flow chart showing the attribute of classifying process (S260)

FIG. 27 is a flow chart showing the attribute classifying process (S260).

As shown in FIG. 27, in step 262 (S262), the wiring design software 3 classifies the pins into 3 groups as described in the above to assign attributes.

The wiring design software 3 also takes out one of the edges of a Delaunay triangle obtained by triangulation, e.g., a triangulated edge having pins of identification numbers STATIC_ID_A, B as the ends thereof (triangulated edge E).

The wiring design software 3 classifies triangulated edges into said 2 groups (Re-entrant group and Normal group) to assign attributes by effecting the processes of S264 to S276 shown in FIG. 27 for all the triangulated edges.

In step 264 (S264), the wiring design software 3 proceeds to the process of S266 when either one of the end points A, B has a Normal attribute, otherwise it proceeds to the process of S268.

In step 266 (S266), the wiring design software 3 classifies the triangulated edge E into the Normal group and assign a NormalEdge attribute to the triangulated edge E.

In step 268 (S268), the wiring design software 3 proceeds to the process of S270 when the end points A, B has a ReEntrantUpper and ReEntrantLower attributes, respectively, otherwise it proceeds to the process of S272.

In step 270 (S270), the wiring design software 3 classifies the triangulated edge E into the re-entrant group and assigns ReEntrantEdge attribute to the triangulated edge E.

In step 272 (S272), the wiring design software 3 proceeds to the process of S274 when the end points A, B has a ReEntrantUpper and ReEntrantLower attributes, respectively, otherwise it proceeds to the process of S276.

In step 274 (S274), the wiring design software 3 classifies the triangulated edge E into the re-entrant group and assigns ReEntrantEdge attribute to the triangulated edge E.

In step 276 (S276), the wiring design software 3 classifies the triangulated edge E into the normal group and assigns NormalEdge attribute to the triangulated edge E.

In step 130 (S130; FIG. 26), the wiring design software 3 effects the same process as S220 shown in FIG. 3 for triangulated edges assigned the NormalEdge in the processes of S262 to S278 to determine division of wirings.

The wiring design software 3 determines that a divide edge assigned the ReEntrant Edge attribute is crossed by a wiring to a pin at the end of the triangulated edge having an identification number larger than the identification number of the pin of the ReEntrantUpper and a wiring to a pin at the end of the triangulated edge having an identification number smaller than the identification number of the pin of the ReEntrantLower.

By processing such ReEntrantEdge, the wiring design software 3 will be able to determine that the triangulated edge 97, 0 shown in FIG. 25 crosses the wirings 98 to 100 connecting the identification numbers STATIC_ID_98, 99, 100, for example.

Also, by processing such ReEntrantEdge, the wiring design software 3 will be able to determine that the triangulated edge 97, 2 crosses the wirings 98 to 100, 0, 1 connecting the identification numbers STATIC_ID_98, 99, 100, 0, 1, for example, though this is different from the example of FIG. 25.

Further, the wiring design software 3 effects a route deriving process similar to S240 shown in FIG. 3 and sends the result of the wiring process to the client computer 10.

It should be also understood that registration of a redundant wiring is eliminated in the crossing determination process in S130 in the manner similar to the elimination described with reference to FIG. 16 and FIG. 17.

In classifying pins into 3 attributes including ReEntrantLower, ReEntrantUpper, and Normal, the wiring design software 3 may divide the pins into 3 equal groups each including consecutive identification numbers and assign ReEntrantLower attribute to the group of least identification numbers, ReEntrantUpper attribute to the group of largest identification numbers, and Normal attribute to the group of the pins other than these two groups.

Specifically, when pins are assigned identification numbers 0 to 100, the wiring design software 3 assigns ReEntrantLower attribute to pins of identification number STATIC_ID_0, 1, 2, . . . ,33, Normal attribute to pins of identification number STATIC_ID_34, 35, 36, . . . . ,66, and ReEntrantUpper attribute to pins of identification number STATIC_ID_67, 68, 69, . . . . , 100 in this method.

In classifying pins into 3 attributes, the wiring design software 3 may assign ReEntrantLower and ReEntrantUpper attributes to a group including pins of the largest identification numbers in a given proportion and a group including pins of the smallest identification numbers in a given proportion, respectively, and Normal attribute to a group of the pins other than these two groups.

Specifically, when pins are assigned identification numbers 0 to 100 in this method with said given proportion being 10%, the wiring design software 3 assigns ReEntrantLower attribute to pins of identification number STATIC_ID_0 1, 2 . . . , 9, Normal attribute to pins of identification number STATIC_ID_11, 12, 13, . . . , 90, and ReEntrantUpper attribute to pins of identification number STATIC_ID_91, 92, 93, . . . , 100.

As shown here in the two examples, the attribute classification may be done normally by dividing the portion where an identification number near the first number is adjacent to an identification number near the last number into ReEntrantLower or ReEntrantUpper attribute without taking the relationship of the identification numbers at the ends of a triangulated edge.

Effect of the Wiring Design Method Given as the Second Embodiment

As described above in the second embodiment the wiring design method of this invention can be applied to the re-entrant portion of pins by classifying pins in a wiring problem into attributes and suitably modifying the crossing determination process shown in the first embodiment.

Also, according to the process effected for the re-entrant portion as described in the second embodiment, pins of the re-entrant portion can be detected to effect a wiring process only based on design information without the need of adding special data to the design information to explicitly indicate the re-entrant portion.

Also, because the increase of processing load resulted from effecting the crossing determination process depending on the attributes is very small, wiring can be designed in a very short time according to the wiring design method of this invention when compared to the conventional wiring design method.

The Third Embodiment

The third embodiment of this invention is now described hereunder.

In the third embodiment, a method of detecting a wiring in which a redundancy (illegality) such as detouring occurs as a result of the wiring design method of this invention as described in the first and the second embodiments.

Figure 28:
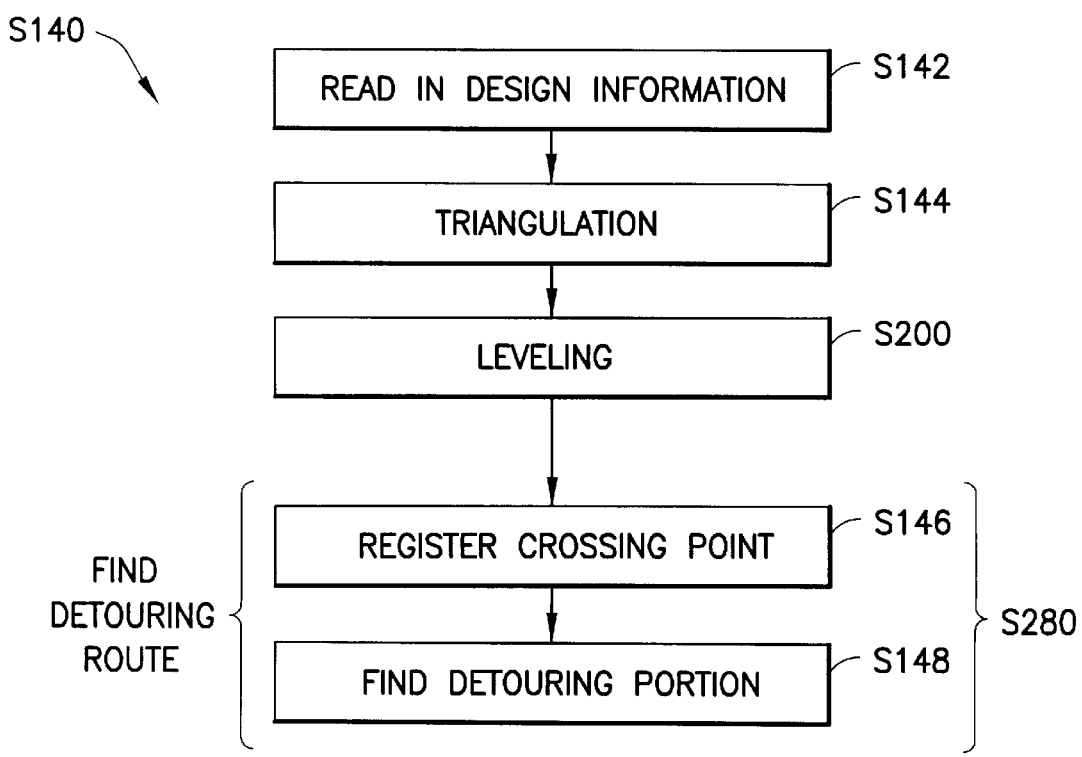
FIG. 28 is a flow chart showing a process (S140) in which the wiring design software (FIG. 2) detects a redundant (illegal) wiring such as detouring wiring in the third embodiment.

FIG. 28 is a flow chart showing a process (S140) in which the wiring design software 3 detects a redundant (illegal) wiring such as detouring wiring.

As shown in FIG. 28, in step 142 (S142), the wiring design software 3 effects the processes of reading design information, preparing a wiring problem and classifying binding pads and pins into source and sink elements in the manner similar to the process of S102 to S106 shown in FIG. 3.

In step 144 (S144), the wiring design software 3 effects the triangulation process in the manner similar to the process of S110 shown in FIG. 3.

In step 200 (S200), the wiring design software 3 effects the leveling process in the manner similar to the process of S200 shown in FIG. 3.

In step 146 (S146) and step 148 (S148), the wiring design software 3 effects a process of finding a detouring route.

Specifically, in step 146 (S146), the wiring design software 3 reads in data required for determining detouring of a wiring, and effects the crossing determination and route deriving processes similar to S220 and S240 shown in FIG. 3 to design a wiring connecting a bonding pad and a pin.

In step 148 (S148), the wiring design software 3 examines the level L of a pin to which a wiring is connected and the level of the ends A, B of each of triangulated edge A, B which are crossed by such wiring.

When the higher one of the levels of the ends of the triangulated edge crossing the wiring (maxL) is larger by 1 than the level L of a pin to which the wiring is connected (maxL>L+1), the wiring design software 3 determines that this wiring highly possibly causes a redundancy (illegality) such as detouring as shown as a route A in FIG. 23, otherwise, it determines that a redundancy is not caused as shown as a route B in FIG. 23.

Incidentally, this process is equivalent to the determination that a wiring highly possibly causes a redundancy (illegality) such as detouring when the lower one of the levels of the ends of the triangulated edge crossing such wiring (maxL) is larger than the level L of a pin to which such wiring is connected.

Also, when the level maxL is larger by (n+1) than the level L (maxL>L+n+1) as it is the case of the crossing determination process shown in the first embodiment, the process of the wiring design software 3 may be modified so as to determine that a redundancy (illegality) is caused in the wiring.

The Processes of S146 and S148 are Further Described

Figure 29:
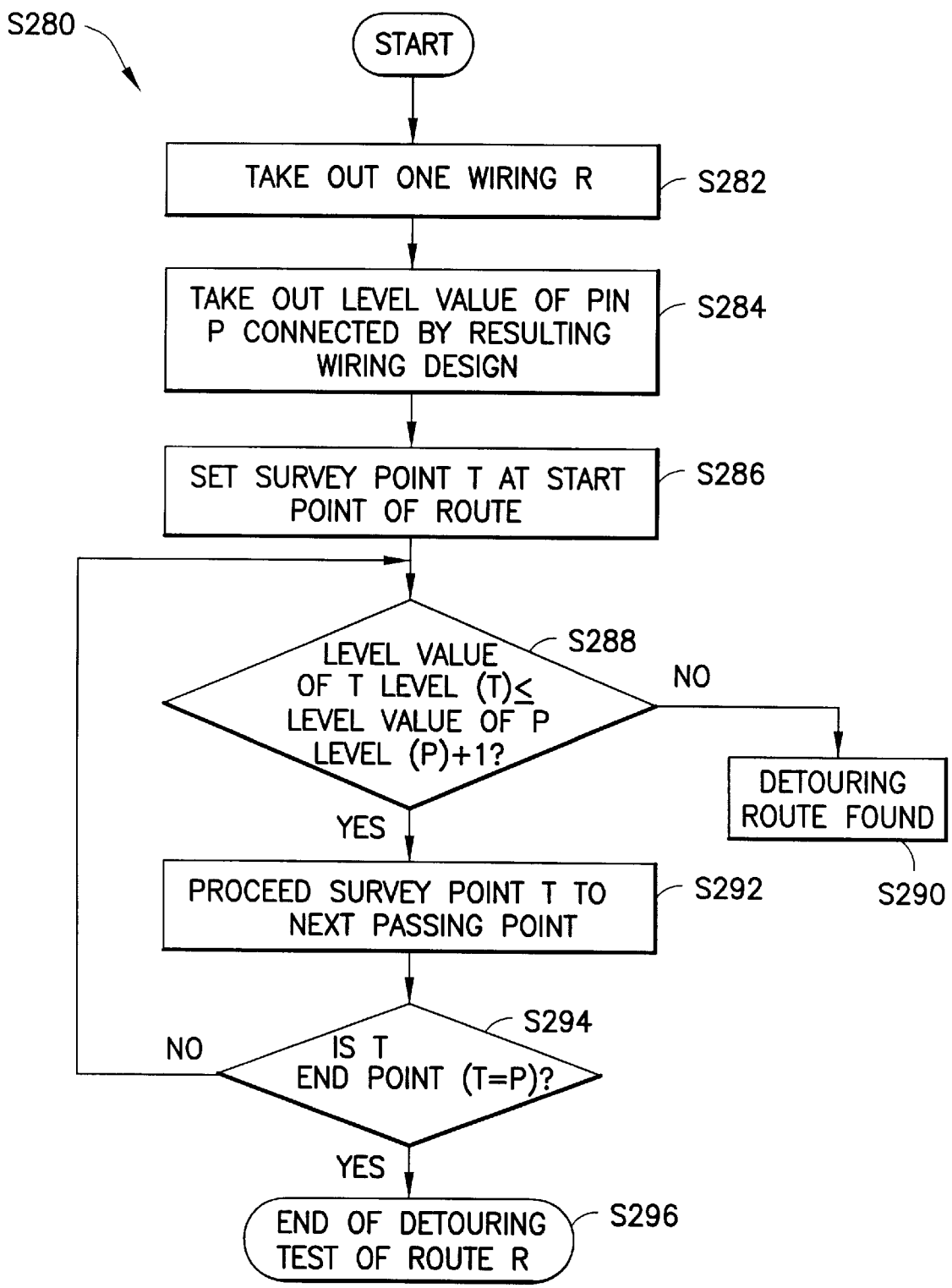
FIG. 29 is a flow chart showing the process of finding a detouring route shown in FIG. 28 (S146, S148; S280).

FIG. 29 is a flow chart showing the process of finding a detouring route shown in FIG. 28 (S146, S148; S280).

The wiring design software 3 repeats the process shown in FIG. 29 for all wirings to find a detouring route.

As shown in FIG. 29, in step 282 (S282), the wiring design software 3 effects a crossing determination process and a route deriving process which are similar to S220 and S240 shown in FIG. 3, designs a wiring connecting a bonding pad and a pin, and takes out one of the designed route (wiring R) to deem it to be the subject of the detouring finding process.

In step 284 (S284), the wiring design software 3 takes out the value L of the level of a pin P to which the taken out wiring R is connected.

In step 286 (S286), the wiring design software 3 sets a survey point T tracing the wiring R at the start point (bonding pad) of the wiring R.

In step 288 (S288), the wiring design software 3 takes out the value of the higher one of the levels of the ends of a triangulated edge passing the survey point T (when the survey point is on a bonding pad or a pin, the level of the bonding pad (=level 0) or the level of the pin) for comparison with the level value L taken out in the process of S284.

The wiring design software 3 proceeds to the process of S290 when the higher one of the levels of the end points of a triangulated edge crossed by the survey point T (Level (T)) is higher by 1 than the level of the pin P to which the wiring P is connected (Level(P)), otherwise it proceeds to the process of S292.

In step 290 (S290), the wiring design software 3 determines that a redundancy (illegality) may possibly occur in the wiring R and proceeds to the detouring finding process for the next wiring.

In step 292 (S292), the wiring design software 3 advances the survey point T to the next crossing (or pin P) of the triangulated edge and the wiring R toward the side of the pin P.

In step 294 (S294), the wiring design software 3 determines whether or not the survey point T reaches the pin P and proceeds to the process of S296 if the survey point T reaches the pin P while it proceeds to the process of S228 if it has not reached the pin P.

In step 296 (S296), the wiring design software 3 determines that there is no redundancy (illegality) such as detouring in the route R and terminates the process.

Effect of the Method Given as the Third Embodiment

Because detouring wiring is detected using a concept of the triangulated edge and the level of a Delaunay triangle according to the wiring design method of this invention which was described in the third embodiment, the amount of data required for processing can be kept in a low level and there is no need of a complicated calculation using coordinate values in determining a detouring. Therefore, the processing time is very short.

Also, because detouring wiring can be detected based on the value of the level, it can be processed for any kind of design information (absence of data dependency).

The Fourth Embodiment

The fourth embodiment of this invention is now described hereunder.

Described in the fourth embodiment is a method of designing a wiring to obtain a resulting wiring which is free from redundancy using the wiring design method of this invention, or an existing wiring design method such as a diextra method and a shortest route method, etc., while quantifying the degree of redundancy such as detouring by using Delaunay triangulation.

While a case of wiring design using an existing wiring design method is described in the fourth embodiment unless specifically mentioned, it should be understood that the wiring design method of this invention so far described may be used in place of the existing wiring design method.

Figure 30:
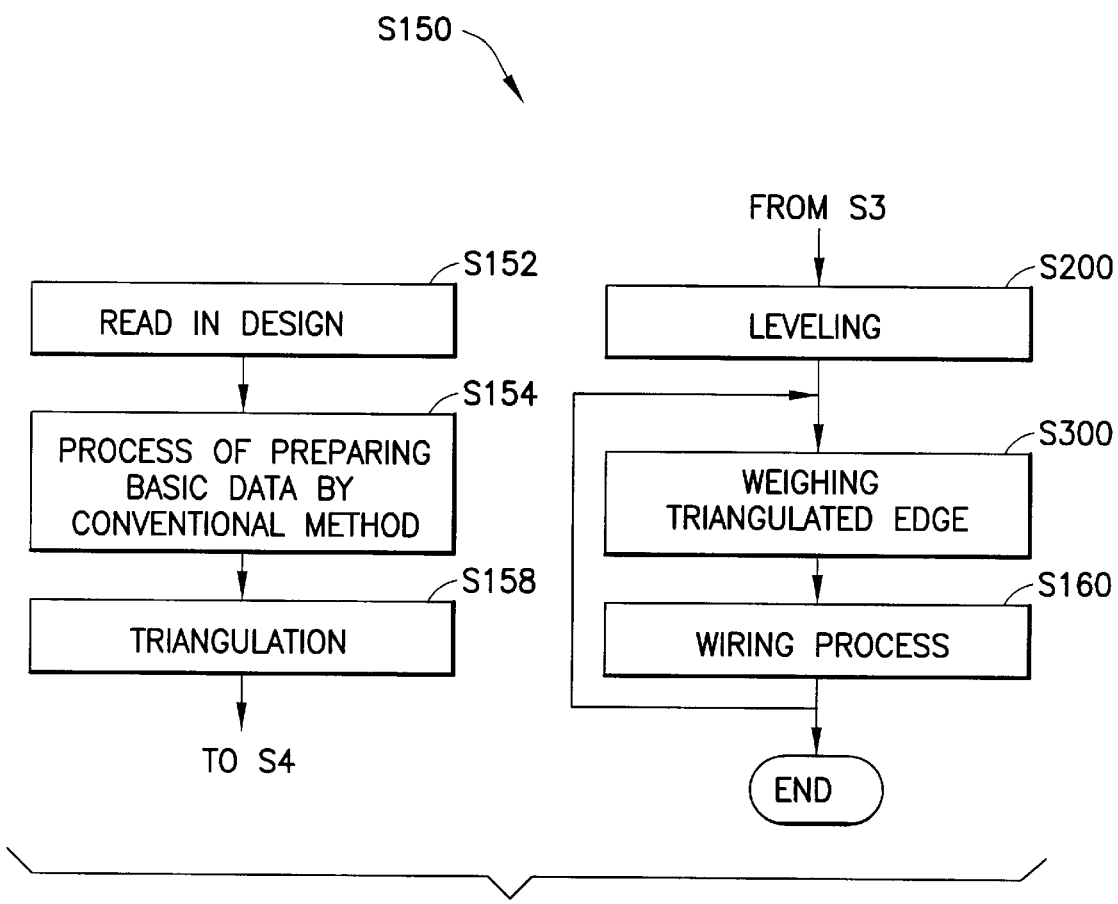
FIG. 30 is a flow chart showing a process (S150) in which the wiring design software 3 quantifies a redundancy (illegality) such as detouring occurring in a wiring in the fourth embodiment.

FIG. 30 is a flow chart showing a process (S150) in which the wiring design software 3 quantifies a redundance (illegality) such as detouring occurring in a wiring in the fourth embodiment. As shown in FIG. 30, in step 152 (S152), the wiring design software 3 reads in design information in the manner similar to the processes of S102 to S106 shown in FIG. 3, prepares wiring information and further classifies bonding pads and pins into source and sink elements based on the prepared wiring information.

In step 154 (S154), the wiring design software 3 prepares information required for wiring design according to an existing method such as a diextra method which is described in "Algorithm C++ (by Robert Sedwick, Kindai Kagaku Co.)" ("Algorithm in C++", 1990, Addison-Wesley Company, Inc., MA, USA), information indicating which bonding pad is connected to which pin, information indicating the shape of a semiconductor chip and the area in which wiring is inhibited on the wiring plane of a semiconductor package, a search graph used for searching wiring route, and other necessary information.

Incidentally, the process of S154 corresponds to the process of preparing the wiring problem (FIG. 3; S104) in the wiring design method of this invention.

In step 156 (S156), a triangulation process is effected for bonding pads (source elements) and pins (sink elements) involved in the wiring problem which was prepared in the process os S154 in the manner similar to the process of S110 shown in FIG. 3.

Further, the wiring design software 3 stores triangulated edges obtained by the triangulation in correlation to the source and the sink elements of the ends.

In step 200 (S200), the wiring design software 3 effects a leveling process in the manner similar to the process of S200 shown in FIG. 3 to set a level in the source and the sink elements.

In step 300 (S300), the wiring design software 3 takes out from the wiring problem prepared in the process of S154 one pair of a sink element and a source element to be connected and weights the search graph using the level value of the taken out sink and source elements.

The Process of Weighting is Explained Using a Specific Example

When the sink element taken out as the subject to be processed in S300 is in the level 3 (the source element is always in the level 0), for example and, therefore, the search graph crosses a triangulated edge having a sink element higher than the level 3 as an end point, it can be determined that a detouring occurs in the search graph and it is further determined that the degree of detouring is larger when the search graph crosses a triangulated edge having a sink element of a higher level as an end point.

According, the wiring design software 3 sets weighting coefficients W to the triangulated edges as shown in the table below, for example, such that the higher the level of the sink element of the end point is, the larger the value of the weighting coefficient W of the triangulated edge is.

TABLE 2

Example of weighting coefficient W set in each triangulated edge when a sink element to be connected is in the level 3.

| Level of Triangulated Edge | Weighting Coefficient W |
|---|---|
| 1 | 1 |
| 2 | 2 |
| 3 | 4 |
| 4 | 8 |
| 5 | 16 |
| 6 | 32 |
| . | . |
| . | . |
| . | . |

The weighting process is described with reference to FIG. 31 using a specific example of a case where the weighting coefficient is doubled every time the level is increased by 1 as shown in the Table 2.

Figure 31:
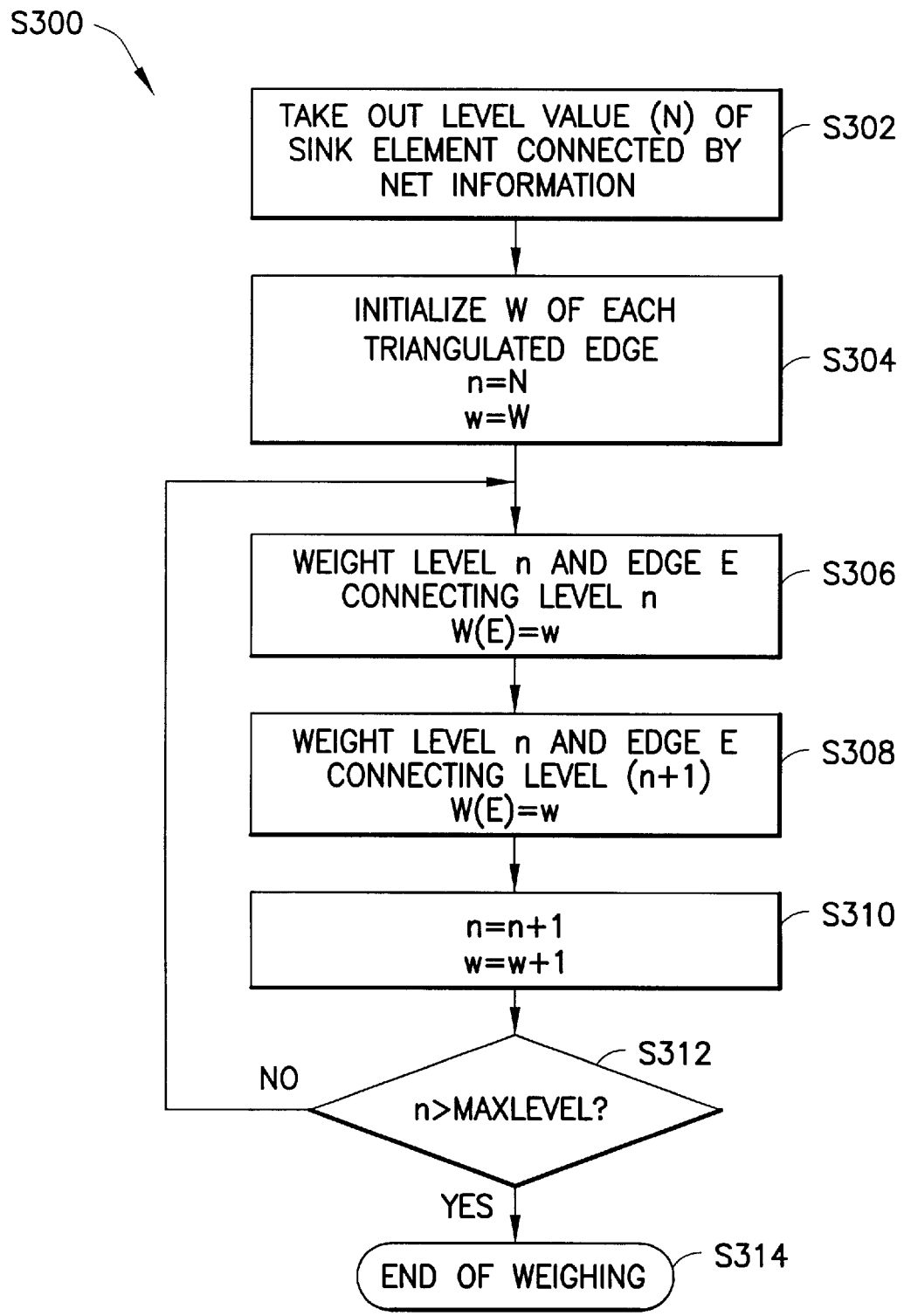
FIG. 31 is a flow chart showing the weighting process (S300) shown in FIG. 30.

FIG. 31 is a flow chart showing the weighting process (S300) shown in FIG. 30.

As shown in FIG. 31, in step 302 (S302), the wiring design software 3 takes out from net information a level value (N) of the sink element to be processed for weighting.

In step 304 (S304), the wiring design software 3 initializes (clear to zero) the weighting coefficient of each triangulated edge, substitutes a variable n used in the process with the level value (N) which was taken out in the process of S302, and further substitutes a variable w with a weighting coefficient W (W=1 in the example shown in the Table 2, for example).

In step 306 (S306), the wiring design software 3 sets the variable w to the weighting coefficient W of the triangulated edge E having sink elements of a level n as the ends (E).

In step 308 (S308), the wiring design software 3 sets the variable w to the weighting coefficient W of the triangulated edge E having a sink element of a level n and a sink element of a level (n+l) as the ends.

In step 310 (S310), the wiring design software 3 increments the variable n to double the variable w.

In step 312 (S312), the wiring design software 3 determines whether or not the value of the variable n is larger than a value MaxLevel indicating the maximum level assigned to a sink element. If n>MaxLevel, the wiring design software 3 returns to the process of S306, otherwise it terminates the weighting process (S314) and proceeds to the process of S160 (FIG. 30).

By the weighting process as described in the above, the triangulated edge in the side nearer the semiconductor chip of a PGA package can be assigned a small weighting coefficient W while an outer triangulated edge can be assigned a larger weighting coefficient.

Reference is now made to FIG. 30 again.

In step 160 (S160), the wiring design software 3 effects a wiring design process using an existing wiring design method.

The processes of S300 and S160 are repeated until all sink and source elements are connected or until it is found that a connection solution is not available for some wiring.

The wiring design process in S160 is described using a specific example of a case where an existing wiring design method partitions a wiring connecting a sink element and a source element at each crossing (node) of the wiring by a mesh which is virtually set on a wiring plane for wiring design, for example, searches a partial route in each partition between the nodes, and connects the partial routes to derive a wiring route.

The wiring design software 3 searches all possible partial routes usable as a partial route (candidate route) between a node from which a wiring route was searched down to a source element in the search so far conducted (the latest node) and a next node to which the latest node is to be connected, and determines whether or not each candidate route crosses the triangulated edge.

The wiring design software 3 calculates an evaluation value by multiplying the weighting coefficient set in the crossing triangulated edge by the length of the candidate route when the candidate route crosses the triangulated edge while it deems the length of the candidate route to be the evaluation value as it is.

As a result of this process, the partition between a source element and a sink element to be processed is connected via one or more wiring routes including one or more candidate routes for each partition.

The wiring design software 3 then accumulates the evaluation value for each partition of the searched wiring route and selects the wiring route having the least accumulated value as a wiring route connecting the source and the sink elements to be processed.

For example, when a wiring route is partitioned into 2 partitions each including m and n candidate routes, respectively, a single wiring route for which the accumulated evaluation value is least is selected among the m×n wiring routes as a wiring route between the source and the sink elements to be processed.

Alternatively, the wiring design software 3 may search the wiring route so as to sequentially select from m candidate routes of the first partition and n candidate routes of the second partition one which has the least evaluation value in each partition, respectively, and extend the wiring sequentially from the source element to the sink element.

The longer the wiring route is, the larger the evaluation value thus calculated is and the evaluation value is larger if detouring occurs even if the wiring route is short. Accordingly, a wiring route in which the length of each wiring and the degree of detouring are optimized can be obtained by a search using the evaluation value.

Modified Embodiment

The length and detouring of the wiring route can be further optimized by combining the search graph used by an existing search algorithm with a division data structure of Delaunay triangle which is level processed to make the value of the weighting coefficient of the triangulated edge adjustable in conformance to the design information.

Also, the method of quantizing the redundancy of the wiring route described in the fourth embodiment may be used in an existing wiring design method or for evaluating the detouring of wiring involved in a resulting wiring design according to the wiring design method of this invention beside the use for evaluating a partial route during wiring design.

Specifically, an evaluation can be effected to determine whether any detouring occurs in a wiring already completed or in which wiring such detouring occurs by triangulating sink and source elements included in the resulting wiring design already completed (FIG. 30; S152), leveling (FIG. 30; S154), weighting a triangulated edge (FIG. 30, FIG. 31), and obtaining an accumulated value of the evaluation value of each wiring route included in the resulting wiring design.

The result of such evaluation is very useful when the user modifies the design information because it can be reflected to the modification of the design information.

Also, by having the wiring design software 3 send the result of the accumulated evaluation value calculated during wiring design to allow the client computer 10 to present a display of the result of the accumulated value to the user from one time to next, the user can determine whether or not the prepared design information is feasible for wiring or gives a good characteristic or begin to modify the design information at an early stage of wiring design.

Effect of the Method Given as the Fourth Embodiment

According to the wiring design method of this invention as described in the fourth embodiment, the amount of data required for processing is kept in a low level and no complicated calculation using coordinate values is needed for determining detouring because detection of detouring and measurement (quantization) of the degree of detouring are effected using the Delaunay triangulated edge and the concept of the level. Accordingly, the processing time is very short.

Also according to the method shown as the fourth embodiment, any design information may be processed (absence of data dependency) because detection and quantization process of detouring can be effected based on the level value.

An evaluation of the resulting wiring and detection of detouring by the naked eye tends to lead to an inexpedience in that the portion where detouring is detected by a human sense may not necessarily match the portion where detouring actually occurs resulting in unavailability of a wiring solution. On the other hand, the resulting wiring design can be evaluated precisely and in a short time according to the method shown as the fourth embodiment.

Fifth Embodiment

The fifth embodiment of this invention is now described hereunder.

Figure 32:
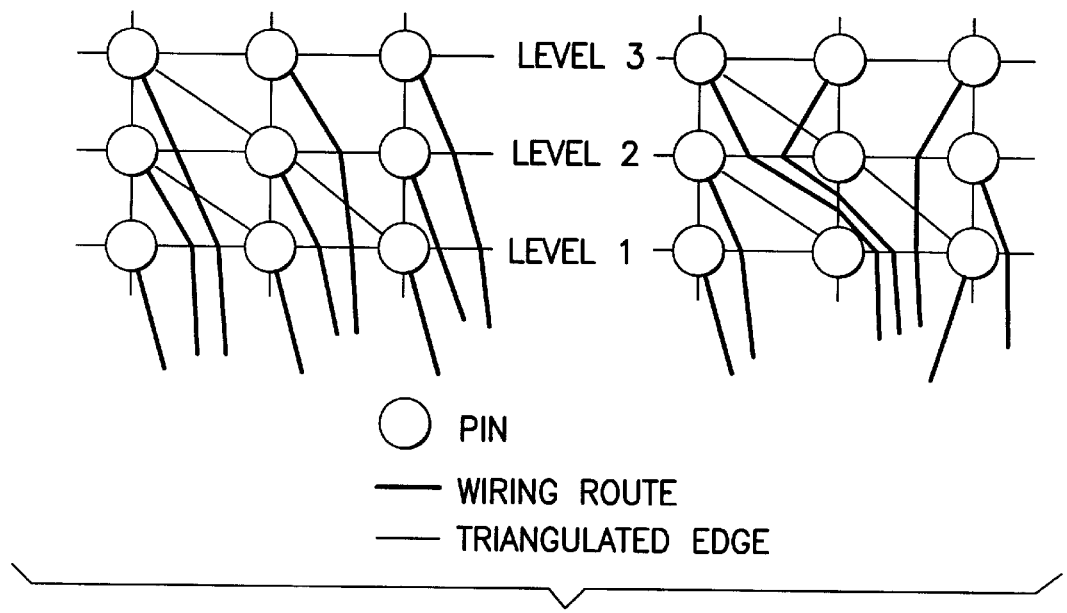
FIG. 32 is a diagram showing wiring which is locally concentrated.

FIG. 32 is a diagram showing wirings which are locally concentrated.

As a semiconductor device is highly integrated and packaged in a high density, it has been an important problem to thread as many wirings as possible through a narrow wiring area.

However, when the wirings are locally concentrated between pins as shown in the right side of FIG. 32, occurrence of such concentration of the wiring has to be avoided because an adverse effect is brought to an electric characteristic.

Though the correcting work for avoiding such concentration of wirings has been so far mostly conducted manually, a manual correction of wirings of a high density requires a lot of labors and presses a worker with a heavy stress.

In the fifth embodiment, a wiring design method is described in which it is so devised that the local concentration of wiring as shown in the right side of FIG. 32 is automatically detected for correction to approximate the wiring density on the wiring plane of a semiconductor package to the uniform wiring as shown in the left side of FIG. 32 when there is a pin to which a wiring is not connected (not 100% net assigned).

Figure 33:
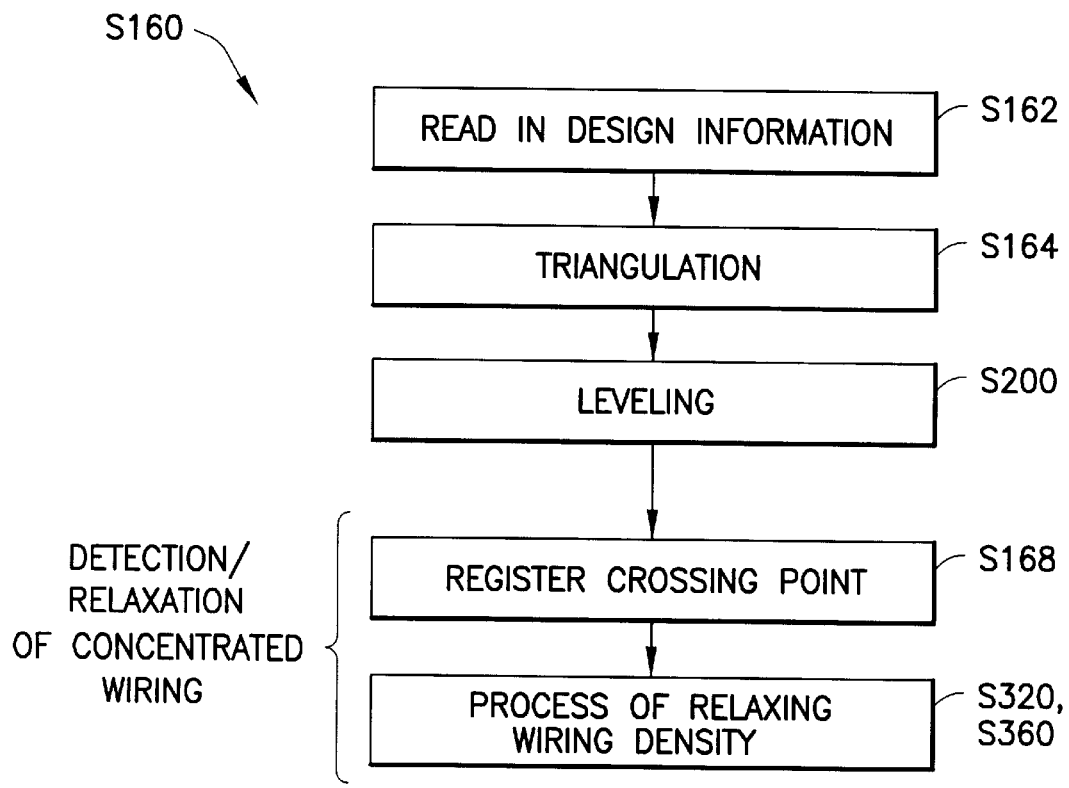
FIG. 33 is a flow chart showing a process in which the wiring design software 3 detects concentration of wiring for correction in the fifth embodiment.

FIG. 33 is a flow chart showing a process in which the wiring design software 3 detects concentration of wiring for correction in the fifth embodiment.

As shown in FIG. 33, in S162, the wiring design software 3 effects the processes of reading design information, generating a wiring problem, classifying the bonding pads and pins into source and sink elements, assigning identification numbers to the bonding pads and the pins, reordering the order of the bonding pads, and generating the source list data in the manner similar to the processes of S102 to S108 shown in FIG. 3.

In step 164 (S164), the wiring design software 3 effects the triangulation process in the manner similar to the process of S110 shown in FIG. 3.

In step 200 (S200), the wiring design software 3 effects the leveling process in the manner similar to the process of S200 shown in FIG. 3.

In step 168 (S168), the wiring design software 3 effects crossing determination in the manner similar to the process of S220 shown in FIG. 3.

In step 320 (S320) and step 360 (S360), the wiring design software 3 detects a local concentration of wiring for all triangulated edges and corrects the wiring route to relax the detected concentration of wiring.

Incidentally, the processes of S320 and S360 are effected for each Delaunay triangulated edge and with any edge processed first.

However, because the wiring density is high between pins of inner periphery while it is lower between the outer periphery in a PGA package, a wiring passing between inside pins of low level is typically moved to a space between outer pins of high level in general. Therefore, the process would be easier if the wiring density is relaxed in sequence beginning at a triangulated edge having pins of a low level at the ends.

By such reason, a case where processing is effected in sequence from a triangulated edge near the bonding pad is described in the fifth embodiment.

Figure 34A:
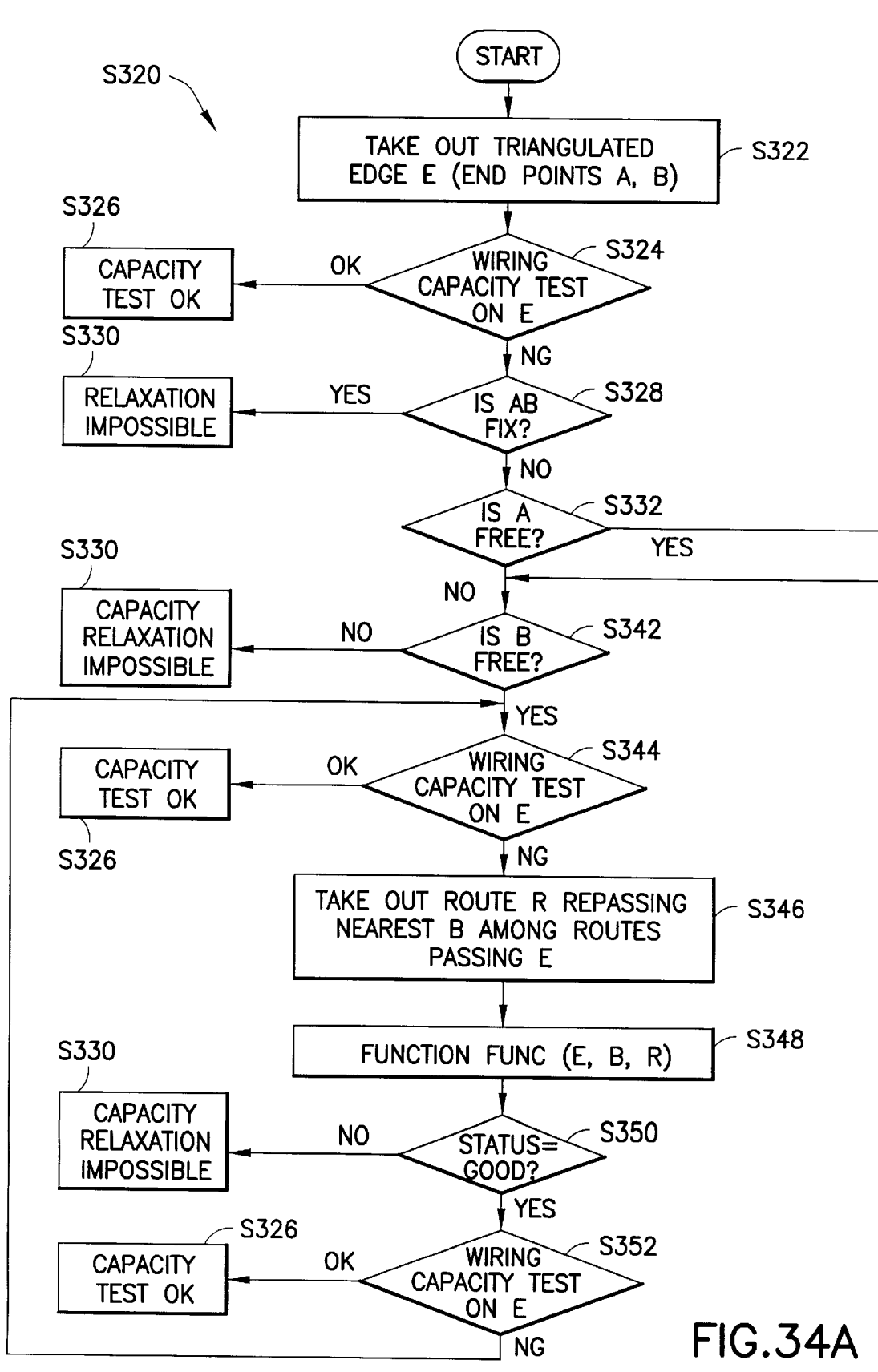
Figure 34:
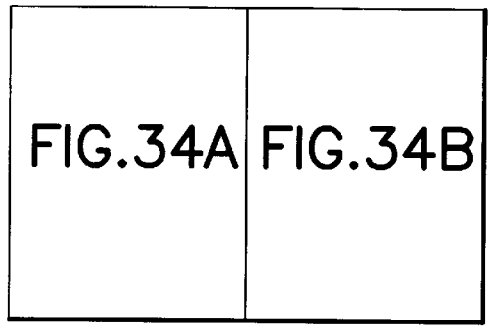
Figure 34B:
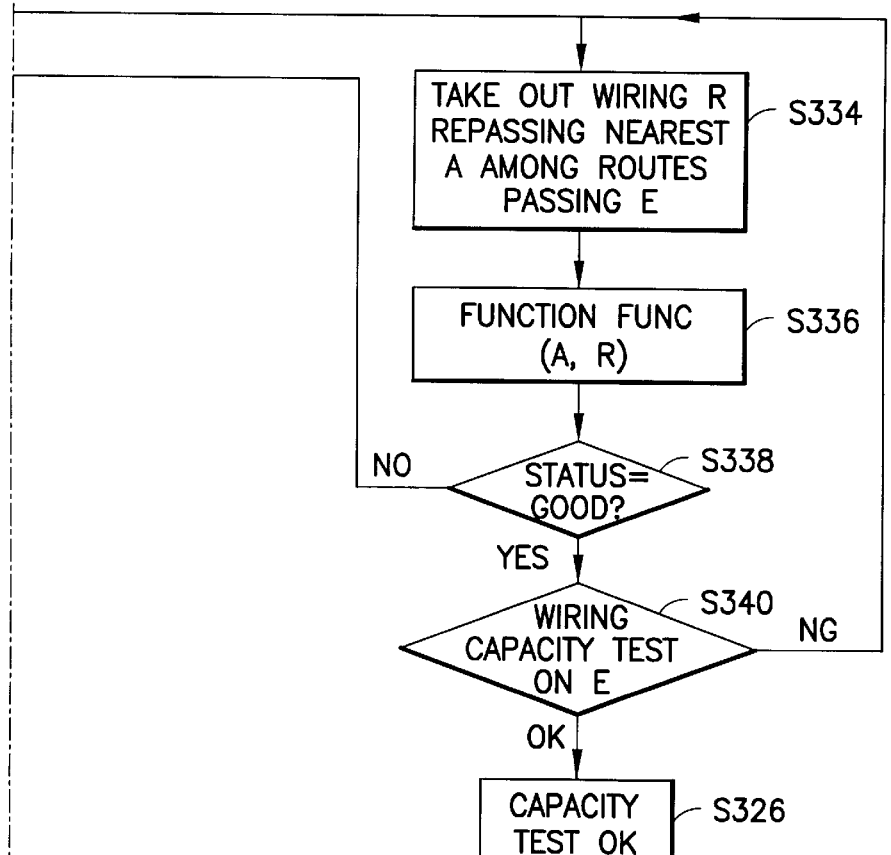

FIGS. 34A and 34B are a flow chart showing the process of detecting a concentration of wiring shown in FIG. 33 (S320).

The wiring design software 3 effects processes shown in FIGS. 34A and 34B for all triangulated edges to detect a concentration of wiring and determines whether or not the wiring density can be relaxed.

In step 322 (S322), the wiring design software 3 takes out one of triangulated edge (triangulated edge E) of a Delaunay triangle.

In step 324 (S324), the wiring design software 3 calculates the number of wirings (wiring capacity) which can pass the triangulated edge E based on the length of the triangulated edge E, the length of wirings passing the triangulated edge E and the design rule of a semiconductor package. The length of wirings passing the triangulated edge E can be calculated by applying the route deriving process based on the result of the crossing determination process.

Further, the wiring design software 3 determines whether or not the number of wirings passing the triangulated edge E is no greater than the calculated wiring capacity and proceeds to the process of S326 when the number is no greater than the wiring capacity while it proceeds to the process of S328 when the number is larger than the wiring capacity.

In step 326 (S326), the wiring design software 3 determines that there is no problem even if the wiring passing the triangulated edge is not be corrected (capacity test OK) and proceeds to processing the next triangulated edge.

In step 328 (S328), the wiring design software 3 determines whether the pins A and B at the ends of the triangulated edge E are wired (whether the pins A, B are in FIX state) and whether the pins A and B at the ends of the triangulated edge E are not wired (whether the pins A, B are in FREE state).

When both the pins A and B are in FIX state, the wiring design software 3 proceeds to the process of S330, otherwise it proceeds to the process of S332.

In step 330 (S330), the wiring design software 3 determines that the wiring passing the triangulated edge E can not be changed (relaxation impossible) and proceeds to processing the next triangulated edge.

Specifically, the wiring design software 3 determines that correction of wiring is impossible when the wiring s of the ends of the triangulated edge E have been decided and can not be changed in the processes of S328 and S330.

In step 332 (S332), the wiring design software 3 determines whether or not the pin A is in the FREE state. The wiring design software 3 proceeds to the process of S346 if the pin A is in the FREE state, otherwise it proceeds to the process of S343.

In step 334 (S334), the wiring design software 3 takes out the wiring R passing a position nearest the pin A of the triangulated edge E.

In step 336 (S336), the wiring design software 3 substitutes the function Func with the pin A and the wiring R to obtain the return value of the function Func (E,A,R).

The return value Status of the function Func is Good when the function Func is able to replace the wiring R with a wiring R' which is not illegal in a route passing a place other than the triangulated edge E and connects the pin and the bonding pad at the ends of the wiring R each other.

The content of the function Func will be described later with reference to FIG. 35.

In step 338 (S338), the wiring design software 3 proceeds to the process of S340 if the return value of the function Func is Good, otherwise it proceeds to the process of S342.

In step 340 (S340), because the wiring R is removed and the wiring capacity has changed, the wiring design software 3 calculates the wiring capacity of the triangulated edge E after the wiring is removed in the manner similar to the process of S324 and proceeds to the process of S326 if the number of wirings remaining in the triangulated edge after the wiring R was removed is no greater than the newly calculated wiring capacity, otherwise it proceeds to the process of S342.

In step 342 (S342), the wiring design software 3 determines whether or not the pin B is in FREE state and proceeds to the process of S344 if the pin B is in FREE state, otherwise it proceeds to the process of S330.

In step 344 (S344), the wiring design software 3 calculates the wiring capacity of the triangulated edge E in the manner similar to the process of S324 and proceeds to the process of S326 if the number of wirings passing the triangulated edge E is no greater than the newly calculated wiring capacity, otherwise it proceeds to the process of S346.

In step 346 (S346), the wiring design software 3 takes out a wiring R passing a position nearest the pin B of the triangulated edge for processing.

In step 348 (S348), the wiring design software 3 substitutes the function Func with the pin B and the wiring R and obtains a return value of the function Func (E, B, R).

The content of the function Func will be described later with reference to FIG. 35 as described in the above.

In step 350 (S350), the wiring design software 3 proceeds to the process of S352 if the return value Status of the function Func is Good, otherwise it proceeds to the process of S330.

In step 352 (S352), because the wiring R is removed and the wiring capacity has changed, the wiring design software 3 calculates the wiring capacity of the triangulated edge E after the wiring is removed in the manner similar to the process of S324 and proceeds to the process of S326 if the number of wirings remaining in the triangulated edge after the wiring R was removed is no greater than the newly calculated wiring capacity, otherwise it proceeds to the process of S344.

Figure 35:
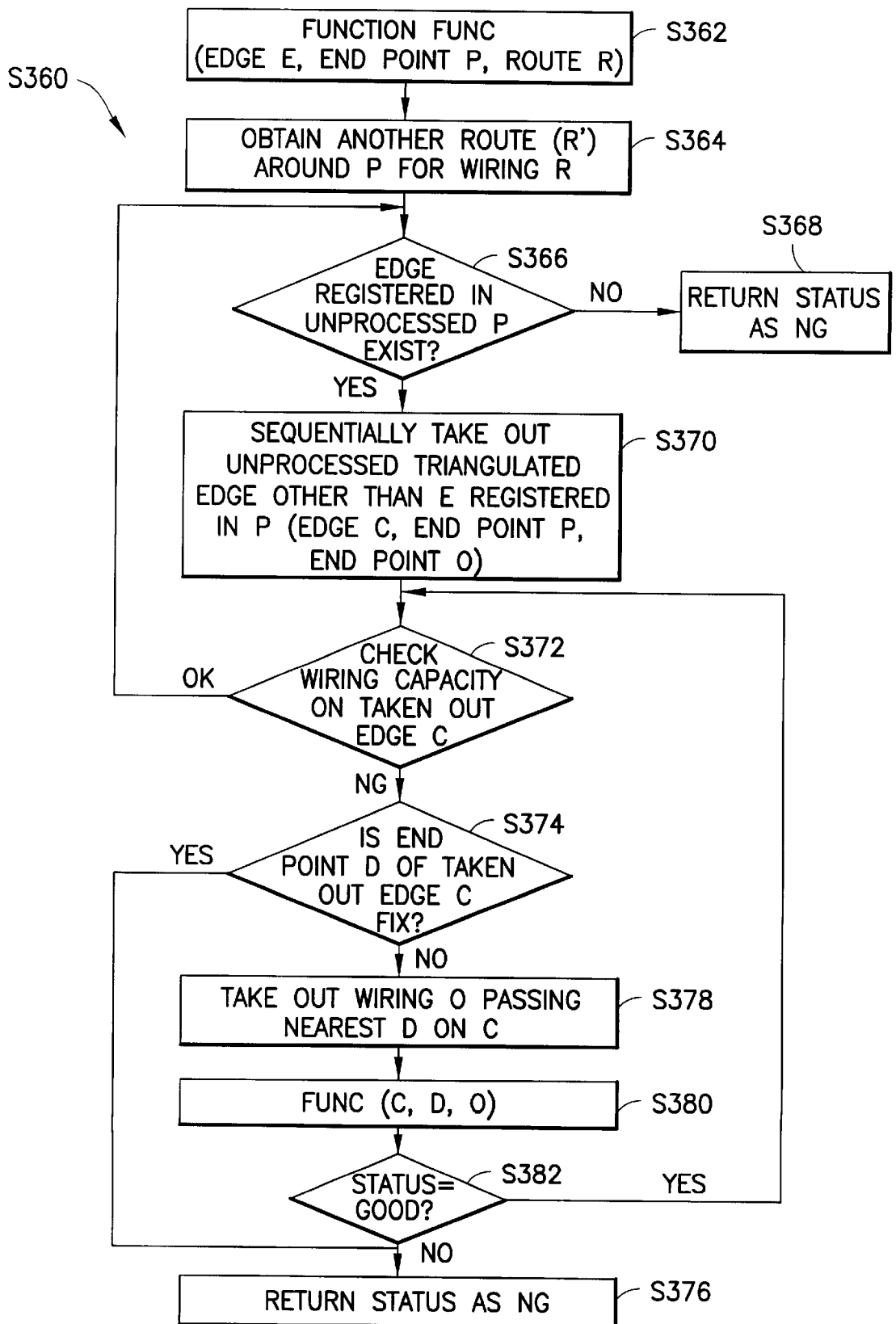
FIG. 35 is a flow chart showing the process of the function Func shown in FIGS. 34A and 34B.

FIG. 35 is a flow chart showing the process of the function Func shown in FIGS. 34A and 34B.

As shown in FIG. 35, in step 362 (S362), the wiring design software 3 calls the function Func using the triangulated edge E, the wiring R and the end point P (either the pin A or the pin B) as parameters.

In step 364 (S364), the function Func derives the route of a wiring R' which connects the same pin and bonding pad as the wiring R.

The function Func derives the route of the wiring R' so that it passes 2 crossing points between the wiring R and a triangulated edge having a pin P (A or B) as one end thereof while it does not cross the triangulated edge E. The wiring design software 3 registers the wiring R' for each triangulated edge which is passed by the wiring R' derived by the function Func.

In step 366 (S366), the function Func determines whether or not there is a triangulated edge which has a pin P as the end point and has not been the subject of processing by the function Func relating to the wiring R (unprocessed triangulated edge). The wiring design software 3 proceeds to the process of S368 if there is no unprocessed triangulated edge, otherwise it proceeds to the process of S370.

In step 368 (S368), the function Func terminates the process leaving the return value Status to the wiring design software 3 in GOOD.

In step 370 (S370), the function Func takes out an unprocessed one of triangulated edges other than the triangulated edge E having a pin P as an end point (triangulated edge C provided it has pins P, D as the end points) in sequence for processing.

In step 372 (S372), the function Func calculates the wiring capacity of the triangulated edge C in the manner similar to the process of S324 of FIGS. 34A and 34B to determine whether or not the number of wirings passing the triangulated edge C is larger than the wiring capacity. The function Func proceeds to the process of S366 if the number of wirings passing the triangulated edge C is no greater than the wiring capacity, otherwise it proceeds to the process of S374.

In step 374 (S374), the function Func determines whether or not an end point other than the pin P of the triangulated edge C (pin D) is in FIX state. The function Func proceeds to the process of S376 if the pin D is in FIX state, otherwise it proceeds to the process of S378 (when the pin is FREE).

In step 378 (S378) and step 380 (S380), the function Func changes the wiring R' to a wiring O which assumes a route nearest the pin D of the end point of the triangulated edge C.

Further, the function Func takes out the wiring O, substitutes the function Func with it along with the triangulated edge C, and recursively calls the function Func (C, D, O).

The function Func is recursively called because a case may arise in which the triangulated edge C which did not cross the wiring R becomes crossing the wiring R' by correcting the wiring route or vise versa resulting in a change of the wiring capacity, and it is necessary to recursively call the function Func for processing.

In step 382 (S382), the function Func determines the return value Status of the function Func (C, D, O) which was called in the process of S376 and returns to the process of S374 when the return value Status is Good, otherwise it proceeds to the process of S376.

In step 376 (S376), the function Func terminates the process returning the return value Status set in NG to the wiring design software 3.

The wiring design software 3 repeats a pass of process including detection of concentrated wirings and correction thereof shown in FIGS. 34A and 34B and FIG. 35 a number of times for each triangulated edge, and counts the number Count of NGs returned from the function Func as a return value Status every time one pass is completed.

When the number of NGs (Count) obtained by processing one pass of detecting the concentrated wirings and correction for a triangulated edge becomes 0, the wiring design software 3 determines that concentration of wiring in the triangulated edge now under processing is resolved and proceeds to the process of detecting the concentrated wirings and correction for another triangulated edge.

However, there may be a case where the number of NGs (Count) does not become 0 even by repeating the pass of detecting the concentrated wirings and correction a number of times. To cope with such situation, the wiring design software 3 stores each number of NGs (Count) obtained in one pass of the process of detecting the concentrated wirings and correction and terminated the process for this triangulated edge when the number of NGs becomes staying in a steady state to proceed to the process of detecting the concentrated wirings and correction for another triangulated edge.

By the process described in the above, data describing a wiring which has been corrected to avoid a local concentration of wiring is transmitted to the client computer 10 and outputted to the monitor device 120, etc.

Modified Embodiment

In the method shown as the fifth embodiment, the threshold may be so changed that the number of wirings passing each triangulated edge is 90% or 80% of the wiring capacity. With such reduced threshold, the electric characteristic of a semiconductor package of a low wiring density can be further improved.

Effect of the Method given as the Fifth Embodiment

As described in the above, the method of detecting a concentration of wiring and correcting the wiring shown as the fifth embodiment requires a very small processing load and the wiring can be corrected in a short time when compared to a conventional method because the method of the fifth embodiment effects processing a triangulated edge by triangulated edge.

Also, according to the method shown as the fifth embodiment, because only the route of concentrated wiring can be corrected, the wiring design need not be restarted from the beginning every time a concentration of wiring is found. Therefore, a load imposed to the user by the wiring design can be largely reduced.

Also, all wirings can be corrected so as to assume ideal routes according to the method shown as the fifth embodiment so long as there is a pin to which a wiring is not connected as described in the above. However, if detouring is permitted, wiring route may be corrected to relax the density according to the method shown as the fifth embodiment even when wiring is connected to all pins.

Incidentally, even when the wiring is not corrected, the method shown as the fifth embodiment may be applied for a case where a wiring is connected to all pins because the presence or absence of a portion of concentrated wiring can be determined.

Effect of the Invention

As described in the above, according to the wiring design apparatus, the wiring determination apparatus and the methods thereof, it can be quickly determined whether or not the wiring is 100% feasible (wiring solution exists) in wiring a printed circuit, etc., before all the wiring design is completed.

Also, according to the wiring design apparatus, the wiring determination apparatus and the methods thereof, an illegal wiring in which a route detours largely or turns around a pin can be quickly and efficiently detected and corrected before all the wiring design is completed in designing wiring in a specific area, particularly in wiring a semiconductor package, etc.

Also, according to the wiring design apparatus, the wiring determination apparatus and the methods thereof, a wiring solution can be quickly and efficiently obtained to detect and correct an illegal wiring in designing a wiring resulting in a large reduction of the labor of the worker.

Also, according to the wiring design apparatus, the wiring determination apparatus and the methods thereof, Delaunay triangulation can be utilized in designing a wiring to quickly and efficiently obtain an optimum wiring solution.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A wiring design apparatus for designing wiring routes which connect a plurality of sink elements on a plane to a plurality of source elements on said plane with a route lying on said plane comprising:

triangle generating means for generating by a Delaunay triangulation method a plurality of virtual triangles each having as apexes at least one of said sink elements and at least one of said source elements, level classifying means for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, and wiring design means for designing a plurality of wiring routes connecting said sink elements to corresponding source elements wherein the level of the sink element forming an apex of one of said generated triangles which is passed by the wiring is the lowest level for each of the wiring routes, wherein the wiring design apparatus provides improved wiring routes connecting said sink elements on said plane to the corresponding source elements on said plane.

2. The wiring design apparatus of claim 1, wherein said wiring design means comprises:

crossing determination means for determining that an edge of one of said generated triangles having as an apex a sink element which is classified as a level no higher than (K+n) is an edge which is crossed by one or more wirings (wirings M) each connecting a sink element which is classified as a level no lower than K to a source element corresponding to said sink element, and route deriving means for sequentially connecting two edges which form a same one of said triangles and are determined to be crossed by said wiring M to derive a route for each of the wiring M.

3. The wiring design apparatus of claim 2, wherein:

said plurality of source elements are bonding pads of a semiconductor chip mounted on a semiconductor package, said plurality of sink elements are terminals provided in said semiconductor package surrounding said semiconductor chip, and said plane is a wiring plane of said semiconductor package on which is provided wiring connecting each of said terminals to each of said bonding pads.

4. The wiring design apparatus of claim 2, wherein:

said wiring design means further comprises identification number assigning means for assigning a sequential identification number to each of the sink elements, said crossing determination means determines that each edge of said triangle is crossed by wiring (wiring M') connecting each of the sink elements (points M'), having an assigned number between the identification numbers of the sink elements at the ends of the edge, to each of the source elements corresponding to each of said points M', and said route deriving means derives a route of each of the wirings M determined to be crossed by each of the edges of said triangle.

5. The wiring design apparatus of claim 4, wherein:

one or more sink elements (points N) having assigned identification numbers near a lowest identification number and one or more sink elements (points N') having assigned identification numbers near a highest identification number form apexes of one of said generated triangles, said apparatus further comprises grouping means for separating from the sink elements a first group containing points N and a last group containing points N', said crossing determination means determines, when a sink element of said first group and a sink element of said last group form apexes of said triangle, that each edge of said triangle is crossed by a wiring M' which connects each of sink elements having assigned identification numbers which are larger than the identification number of the sink elements of the last group and sink elements having assigned identification numbers which are smaller than the identification number of the sink elements of the first group to each corresponding source element, and said route deriving means derives the route of each of the wirings M' which is determined to cross each edge of said triangle.

6. The wiring design apparatus of claim 5, wherein:

said apparatus further comprises route modifying means for modifying, when the number of said wirings M' crossing the edge of said triangle is larger than a predetermined wiring capacity, a route of said wiring M' crossing said edge to a route crossing an edge of another triangle.

7. A wiring design apparatus for designing wiring routes which connect a plurality of sink elements on a plane to a plurality of source elements on said plane with a route lying on said plane, said wiring passing a wiring route including a predetermined partial route, said apparatus comprising:

triangle generating means for generating by a Delaunay triangulation method a plurality of virtual triangles each having as apexes at least one of said sink elements and at least one of said source elements, level classifying means for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, weighting coefficient setting means for setting a weighting coefficient, wherein the weighting coefficient has as larger value as said level is higher, and partial route selecting means for selecting said partial route such that a cumulative sum of multiplication of the length of each of said partial route by a weighting coefficient set to each of the edge of said triangle crossing each of said partial route is minimized, wherein the wiring design apparatus provides improved wiring routes connecting the sink elements on said plane to the corresponding source elements on said plane.

8. A wiring determination apparatus for determining the validity of wiring routes which connect a plurality of sink elements on a plane to a plurality of source elements on said plane with a route lying on said plane comprising:

triangle generating means for generating by a Delaunay triangulation method a plurality of virtual triangles each having as apexes at least one of said sink elements and at least one of said source elements, level classifying means for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, and wiring determination means for determining that a wiring route connecting a sink element classified as a level K to a source element is valid when said wiring route crosses only an edge of said triangle having only sink elements classified as a level lower than (K+n+1) (n is an integer) as the ends thereof, and determining that a wiring connecting a sink element classified as a level K to a source element is invalid when said wiring route crosses an edge of said triangle having only sink elements classified as a level higher than (K−1) as the ends thereof, wherein the wiring determination apparatus identifies the validity of wiring routes connecting the sink elements on said plane to the corresponding source elements on said plane.

9. A wiring determination apparatus for determining the validity of wiring routes which connect a plurality of sink elements on a plane to a plurality of source elements on said plane with a route lying on said plane comprising:

triangle generating means for generating by a Delaunay triangulation method a plurality of virtual triangles each having as apexes at least one of said sink elements and at least one of said source elements, level classifying means for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, weighting coefficient setting means for setting a weighting coefficient, wherein the weighting coefficient has as larger value as said level is higher, and wiring determination means for accumulating the sum of multiplication of the length of each of said partial route by a weighting coefficient set to each of the edge of said triangle crossing each of said partial route to determine the validity of each of said wiring routes, wherein the wiring determination apparatus identifies the validity of wiring routes connecting the sink elements on said plane to the corresponding source elements on said plane.

10. A wiring design method for designing wiring routes which connect a plurality of sink elements on a plane to a plurality of source elements on said plane with a route lying on said plane comprising the steps of:

generating by a Delaunay triangulation method a plurality of virtual triangles having as apexes at least one of said sink elements and at least one of said source elements, classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, and designing a plurality of wiring routes connecting said sink elements to corresponding source elements wherein the level of the sink element forming an apex of one of said generated triangles which is passed by the wiring is the lowest level for each of the wiring routes, wherein the wiring design method provides improved wiring routes connecting said sink elements on said plane to the corresponding source elements on said plane.

11. The wiring design method of claim 10, further comprising:

determining that an edge of one of said generated triangles having as an apex a sink element which is classified as a level lower than (K+n+1) is an edge which is crossed by one or more wirings (wirings M) each connecting a sink element which is classified as a level above (K−1) to a source element corresponding to said sink element, and sequentially connecting two edges which form a same one of said triangles and are determined to be crossed by said wiring M to derive a route of the wiring M.

12. A wiring determination method for determining the validity of wiring routes which connect a plurality of sink elements on a plane to a plurality of source elements on said plane with a route lying on said plane comprising:

generating by a Delaunay triangulation method a plurality of virtual triangles having as apexes one of said sink elements and one of said source elements, classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, and determining that a wiring route connecting a sink element classified as a level K to a source element is valid when said wiring route crosses only an edge of said triangle having only sink elements classified as a level lower than (K+n+1) (n is an integer) as the ends thereof, and determining that a wiring route connecting a sink element classified as a level K to a source element is invalid when said wiring route crosses an edge of said triangle having only sink elements classified as a level higher than (K−1) as the ends thereof, wherein the wiring determination method determines the validity of wiring routes connecting said sink elements on said plane to the corresponding source elements on said plane.

13. A computer readable recording medium recording a program for use in a wiring design apparatus for designing wiring routes which connect a plurality of sink elements on a plane to a plurality of source elements on said plane with a route lying on said plane, said program causing a computer to execute:

a triangle generating step for generating by a Delaunay triangulation method a plurality of virtual triangles having as apexes at least one of said sink elements and at least one of said source elements, a level classifying step for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, and a wiring design step for designing a plurality of wiring routes connecting said sink elements to corresponding source elements wherein the level of the sink element forming an apex of one of said generated triangles which is passed by the wiring is the lowest level for each of the wiring routes, and wherein said program provides improved wiring routes connecting said sink elements on said plane to the corresponding source elements on said plane.

14. The computer readable recording medium of claim 13, wherein said wiring design step further comprises:

a crossing determination step for determining that an edge of one of said generated triangles having as an apex a sink element which is classified as a level no higher than (K+n) is an edge which is crossed by one or more wirings (wiring M) each connecting a sink element which is classified as a level no lower than K to a source element corresponding to such sink element, and a route deriving step for sequentially connecting two edges which form a same one of said triangles and are determined to be crossed by said wiring M to derive a route of the wiring M.

15. The computer readable recording medium of claim 14, wherein said wiring design step further comprises:

an identification number assigning step for assigning a sequential identification number to each of the sink elements, said crossing determination step determines that each edge of said triangle is crossed by wiring (wiring M') connecting each of the sink elements (points M') having an assigned number between the identification numbers of the sink elements at the ends of the edge to each of the source elements corresponding to each of said points M', and said route deriving step derives a route of each of the wirings M' determined to be crossed by each of the edges of said triangle.

16. The computer readable recording medium of claim 15, wherein:

one or more sink elements (points N) having assigned identification numbers near a lowest identification number and one or more sink elements (points N') having assigned identification numbers near a highest identification number form apexes of one of said generated triangles, said recording medium further records a grouping step for separating from the sink elements a first group containing points N and a last group containing points N', said crossing determination step determines, when the sink element of said first group and the sink element of said last group form apexes of said triangle, that each edge of said triangle is crossed by a wiring M' which connects each of sink elements having assigned identification numbers which are larger than the identification number of the sink elements of the last group and sink elements having assigned identification numbers which are smaller than the identification number of the sink elements of the first group to each corresponding source element, and said route deriving step derives the route of each of the wirings M' which is determined to cross each edge of said triangle.

17. The recording medium of claim 16, further comprising:

a route modifying step for modifying, when the number of said wirings M' crossing the edge of said triangle is larger than a predetermined wiring capacity, a route of said wiring M' crossing said edge to a route crossing the edge of another triangle.

18. A computer readable recording medium recording a program for use in a wiring design apparatus for designing wiring routes which connect a plurality of sink elements on a plane to a plurality of source elements on said plane with a route lying on said plane, said wiring passing a wiring route including a predetermined partial route, said program causing a computer to execute:

a triangle generating step for generating by a Delaunay triangulation method a plurality of virtual triangles having as apexes at least one of said sink elements and at least one of said source elements, a level classifying step for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, a weighting coefficient setting step for setting a weighting coefficient, wherein the weighting coefficient has as larger value as said level is higher, and a partial route selecting step for selecting said partial route such that a cumulative sum of multiplication of the length of each of said partial route by a weighting coefficient set to each of the edge of said triangle crossing each of said partial route is minimized, wherein said program provides improved wiring routes connecting said sink elements on said plane to the corresponding source elements on said plane.

19. A computer readable recording medium recording a program for use in a wiring determination apparatus for determining the validity of wiring routes which connect a plurality of sink elements on a plane to a plurality of source elements on said plane with a route lying on said plane, said program causing a computer to execute:

a triangle generating step for generating by a Delaunay triangulation method a plurality of virtual triangles having as apexes at least one of said sink elements and at least one of said source elements, a level classifying step for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, and a wiring determination step for determining that a wiring route connecting a sink element classified as a level K to a source element is valid when said wiring route crosses only an edge of said triangle having only sink elements classified as a level lower than (K+n+1) (n is an integer) as the ends thereof, and determining that a wiring connecting a sink element classified as a level K to a source element is invalid when said wiring route crosses an edge of said triangle having only sink elements classified as a level higher than (K−1) as the ends thereof, wherein said program determines the validity of wiring routes connecting said sink elements on said plane to the corresponding source elements on said plane.

20. A computer readable recording medium recording a program for use in a wiring determination apparatus for determining the validity of wiring routes which connect a plurality of sink elements on a plane to a plurality of source elements on said plane with a route lying on said plane, said wiring passing a wiring route including a predetermined partial route, said program causing a computer to execute:

a triangle generating step for generating by a Delaunay triangulation method a plurality of virtual triangles having as apexes at least one of said sink elements and at least one of said source elements, a level classifying step for classifying a level for each sink element, wherein a first sink element forming an apex of one of said generated triangles, which also has as an apex one of said source elements, is classified as a lowest level (level 1), and a second sink element forming an apex of another of said generated triangles, which also has as an apex a sink element of a level K, is classified as a level (K+1), wherein K is an integer equal to or greater than 1, a weighting coefficient setting step for setting a weighting coefficient, wherein the weighting coefficient has as larger value as said level is higher, and a wiring determination step for accumulating the sum of multiplication of the length of each of said partial route by a weighting coefficient set to each of the edge of said triangle crossing each of said partial route to determine the validity of each of said wiring routes, wherein said program determines the validity of wiring routes connecting said sink elements on said plane to the corresponding source elements on said plane.

* * * * *